United States Patent
Kim et al.

(10) Patent No.: US 12,237,107 B2
(45) Date of Patent: Feb. 25, 2025

(54) MOUNTING JIG FOR MANUFACTURING TILING DISPLAY DEVICE, AND TILING DISPLAY DEVICE AND MANUFACTURING METHOD THEREFOR

(71) Applicant: LG Display Co., Ltd., Seoul (KR)

(72) Inventors: Han Seok Kim, Paju-si (KR); Sung Hwan Yoon, Seoul (KR); Sang Ok Seon, Paju-si (KR); Jae Jun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/544,044

(22) Filed: Dec. 18, 2023

(65) Prior Publication Data

US 2024/0120137 A1 Apr. 11, 2024

Related U.S. Application Data

(63) Continuation of application No. 17/777,423, filed as application No. PCT/KR2020/004164 on Mar. 27, 2020.

(30) Foreign Application Priority Data

Nov. 27, 2019 (KR) ........................ 10-2019-0154525

(51) Int. Cl.
*H01F 7/02* (2006.01)
*H01F 7/04* (2006.01)
*H05K 5/00* (2006.01)

(52) U.S. Cl.
CPC ............. *H01F 7/0257* (2013.01); *H01F 7/04* (2013.01); *H05K 5/0018* (2022.08); *H05K 5/0021* (2013.01)

(58) Field of Classification Search
CPC ......... H01F 7/0257; H01F 7/04; H01F 7/0252
See application file for complete search history.

(56) References Cited

U.S. PATENT DOCUMENTS

| 2017/0105293 A1 | 4/2017 | Kim |
| 2018/0019267 A1 | 1/2018 | Saeki |

(Continued)

FOREIGN PATENT DOCUMENTS

| CN | 102114669 A | 7/2011 |
| CN | 106463083 A | 2/2017 |

(Continued)

*Primary Examiner* — Jason L Vaughan
*Assistant Examiner* — Amanda Kreiling
(74) *Attorney, Agent, or Firm* — Birch, Stewart, Kolasch & Birch, LLP

(57) ABSTRACT

A mounting jig for manufacturing a tiling display device can include a supporting member, a plurality of jig magnets fixed to the supporting member, a hinge structure configured to rotate the plurality of jig magnets, and a guard rail configured to rotate in response to a rotation of the plurality of jig magnets, to reduce damage caused during detachment or attachment. The tiling display device includes a plurality of display devices disposed in the form of tiles. Each of the plurality of display devices includes a plurality of display elements, a plurality of circuits, a plurality of lines and a plurality of parts. The plurality of display elements can be a light emitting diode (LED) or a micro-LED including an n-type semiconductor layer, a p-type semiconductor layer, and a light emitting layer.

20 Claims, 21 Drawing Sheets

510(511,512,513,514)
530(531,532,533,534)
540(541,542,543,544)

(56) References Cited

U.S. PATENT DOCUMENTS

2018/0031919 A1\* 2/2018 Ryu .................. H01F 7/0221
2018/0323223 A1 11/2018 Saeki

FOREIGN PATENT DOCUMENTS

| CN | 108766267 A | 11/2018 |
| --- | --- | --- |
| CN | 109716423 A | 5/2019 |
| KR | 10-2011-0081082 A | 7/2011 |
| KR | 10-2016-0076765 A | 7/2016 |
| KR | 10-2018-0011983 A | 2/2018 |
| KR | 10-1898706 B1 | 9/2018 |
| KR | 10-2051604 B1 | 12/2019 |
| WO | WO 2018/207273 A1 | 11/2018 |

\* cited by examiner

MOUNTING JIG FOR MANUFACTURING TILING DISPLAY DEVICE, AND TILING DISPLAY DEVICE AND MANUFACTURING METHOD THEREFOR

CROSS REFERENCE TO RELATED APPLICATIONS

This application is a Continuation application of U.S. patent application Ser. No. 17/777,423, filed on May 17, 2022, which was filed as the National Stage filing under 35 U.S.C. 371 of International Application No. PCT/KR2020/004164, filed on Mar. 27, 2020, which claims the benefit of earlier filing date and right of priority to Korean Application No. 10-2019-0154525, filed on Nov. 27, 2019, where the entire contents of all these applications are hereby incorporated by reference herein into the present application.

BACKGROUND OF THE DISCLOSURE

Technical Field

The present disclosure relates to a mounting jig for manufacturing a tiling display device and a manufacturing method of a tiling display device using the same, and more particularly, to a mounting jig for manufacturing a tiling display device that reduces damage to a display device during a tiling operation, and a manufacturing method of a tiling display device using the same.

Background Art

Display devices used in computer monitors, TVs, and mobile phones include organic light emitting displays (OLEDs) and the like that emit light by themselves, and liquid crystal displays (LCDs) and the like that require a separate light source.

Display devices are being applied to more and more various fields including not only computer monitors and TVs, but also personal mobile devices, and thus, display devices having a reduced volume and weight while having a wide display area are being studied.

Meanwhile, in recent years, a tiling display device having an enlarged display area by connecting a plurality of display devices is used as an advertisement board or the like.

SUMMARY OF THE DISCLOSURE

First, display devices are being used from a small-sized electronic device used in a mobile phone or the like to a large-sized electronic device such as a large-sized TV. As such, display devices are manufactured to have sizes from small sizes to large sizes of several tens of inches and are used for various purposes. However, it is technically difficult to manufacture a display device having a size of several hundred inches or more. Instead, a tiling display device having a larger display area by connecting a plurality of display devices is used. In addition, a tiling display device composed of a plurality of display devices is attached to a wall to be used as an advertisement board, or is used as a large electric billboard in a stadium or an outdoor advertisement electric billboard.

Such a tiling display device may be implemented by, for example, disposing a fixing mechanism on rear surfaces of a plurality of display devices and fastening the fixing mechanism to a wall part. However, in a process of using the mechanism disposed on the rear surface of the display device, since an operator is located behind the wall part and performs a fastening process, there is a problem in that a space for the operator needs to be secured behind the wall part. Also, when using mechanism, there may be a mechanism tolerance, and it may be difficult to precisely arrange a plurality of display devices on the wall part. If a misalignment occurs between a plurality of display devices, there is a problem in that a boundary area between the plurality of display devices in which an image is not viewed is visible, and thus the quality of an image is degraded.

Accordingly, the inventors of the present disclosure have invented a method for fastening a plurality of display devices to a wall part using magnets so that an operation of tiling the plurality of display devices can also be performed on a front surface of the display device. Specifically, a display device has a plurality of panel magnets disposed on its rear surface and a mounting jig including a plurality of jig magnets is attached to the front surface of the display device, so that the display device can be transported and attached to the wall part. That is, the mounting jig may be attached to the front surface of the display device by using attractive forces between the plurality of jig magnets of the mounting jig and the plurality of panel magnets of the display device, and an operator may grip the mounting jig and may move the display device to the wall part and attach it to the wall part.

However, the inventors of the present disclosure have recognized a problem in that, when the mounting jig is attached to the front surface of the display device, the mounting jig is suddenly attached to the display device due to the attractive force between the jig magnet and the panel magnet, and an impact is applied to the display device. In addition, they have recognized a problem in that, when the mounting jig is separated from the display device attached to the wall part, the display device is lifted or detached from the wall part due to the attractive force between the panel magnet and the jig magnet, thereby causing misalignment in position or an impact being applied. Accordingly, the inventors of the present disclosure have invented a mounting jig for manufacturing a tiling display device, that solves problems in which an impact is applied to a display device due to attractive forces between a jig magnet of the mounting jig and a panel magnet of the display device or the display device is detached from the wall part, and a manufacturing method of a tiling display device using the mounting jig.

An object of the present disclosure is to provide a mounting jig for manufacturing a tiling display device capable of minimizing damage to a display device by impacts during an alignment process of a plurality of display devices, and a manufacturing method of the tiling display device using the same.

Another object of the present disclosure is to provide a mounting jig for manufacturing a tiling display device that reduces attachment of a mounting jig to a display device while the mounting jig gives a strong impact to the display device due to attractive forces between magnets when the mounting jig is attached to the display device, and a manufacturing method of the tiling display device using the same.

Another object of the present disclosure is to provide a mounting jig for manufacturing a tiling display device that reduces detachment of a tiling display device of which tiling is completed, from a wall part due to an attractive force with the mounting jig, and a manufacturing method of the tiling display device using the same.

Another object of the present disclosure is to provide a mounting jig for manufacturing a tiling display device that reduces misalignment of the display device due to attractive forces between the display device of which tiling is completed and the mounting jig, and a manufacturing method of the tiling display device using the same.

Another object of the present disclosure is to provide a mounting jig for manufacturing a tiling display device capable of easily adjusting a distance between a plurality of display devices attached to a wall part, and a manufacturing method of the tiling display device using the same.

Another object of the present disclosure is to provide a mounting jig for manufacturing a tiling display device that does not need to secure a space behind a wall part because a process of tiling a plurality of display devices can be performed on a front surface of the display device, and a manufacturing method of the tiling display device using the same.

Objects of the present disclosure are not limited to the above-mentioned objects, and other objects, which are not mentioned above, can be clearly understood by those skilled in the art from the following descriptions.

In order to solve the above problems, a mounting jig for manufacturing a tiling display device according to an embodiment of the present disclosure includes a supporting member, a plurality of jig magnets fixed to the supporting member, a hinge structure configured to rotate the plurality of jig magnets, and a guard rail rotating in response to rotation of the plurality of jig magnets and reducing damage caused during detachment or attachment. Accordingly, when the mounting jig is attached to the display device, a safety distance may be secured by disposing the guard rail between the display device and the jig magnets, and the mounting jig may be slowly attached without giving an impact to the display device.

In order to solve the above problems, a manufacturing method of a tiling display device according to an embodiment of the present disclosure includes attaching a mounting jig including a plurality of jig magnets to a display device including a plurality of panel magnets and a plurality of panel ferromagnetic bodies, attaching the display device to a wall part using the mounting jig, and detaching the mounting jig from the display device. Prior to the attaching of the mounting jig, a first plate of a guard rail of the mounting jig is disposed between the plurality of jig magnets and the display device. Therefore, prior to attaching the mounting jig, it is possible to reduce attachment of the mounting jig while the mounting jig gives a strong impact to the display device by disposing the first plate of the guard rail for securing a safety distance between the jig magnets and the panel magnets.

Other detailed matters of the exemplary embodiments are included in the detailed description and the drawings.

According to the present disclosure, it is possible to reduce a sudden attachment of a mounting jig to a display device while the mounting jig gives a strong impact to the display device.

According to the present disclosure, it is possible to reduce detachment of the display device attached to the wall part due to the jig magnets of the mounting jig.

According to the present disclosure, it is possible to reduce damage to the display devices by colliding with the mounting jig or the wall part when a plurality of the display devices are aligned.

According to the present disclosure, it is possible to reduce a misalignment in position of the display device by the jig magnets of the mounting jig when the plurality of display devices are aligned.

According to the present disclosure, it is possible to easily adjust a distance and a misalignment between a plurality of display devices without disassembling each of the plurality of display devices.

According to the present disclosure, arrangement of each of the display devices can be controlled on front surfaces of the plurality of display devices.

In a tiling display device including a plurality of display devices according to the present disclosure, each of the plurality of display devices may be easily installed, maintained, and repaired.

According to the present disclosure, it is possible to reduce a decrease in immersion due to a boundary area between the plurality of display devices when viewing an image by minimizing the distance between the plurality of display devices.

The effects according to the present disclosure are not limited to the contents exemplified above, and more various effects are included in the present specification.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
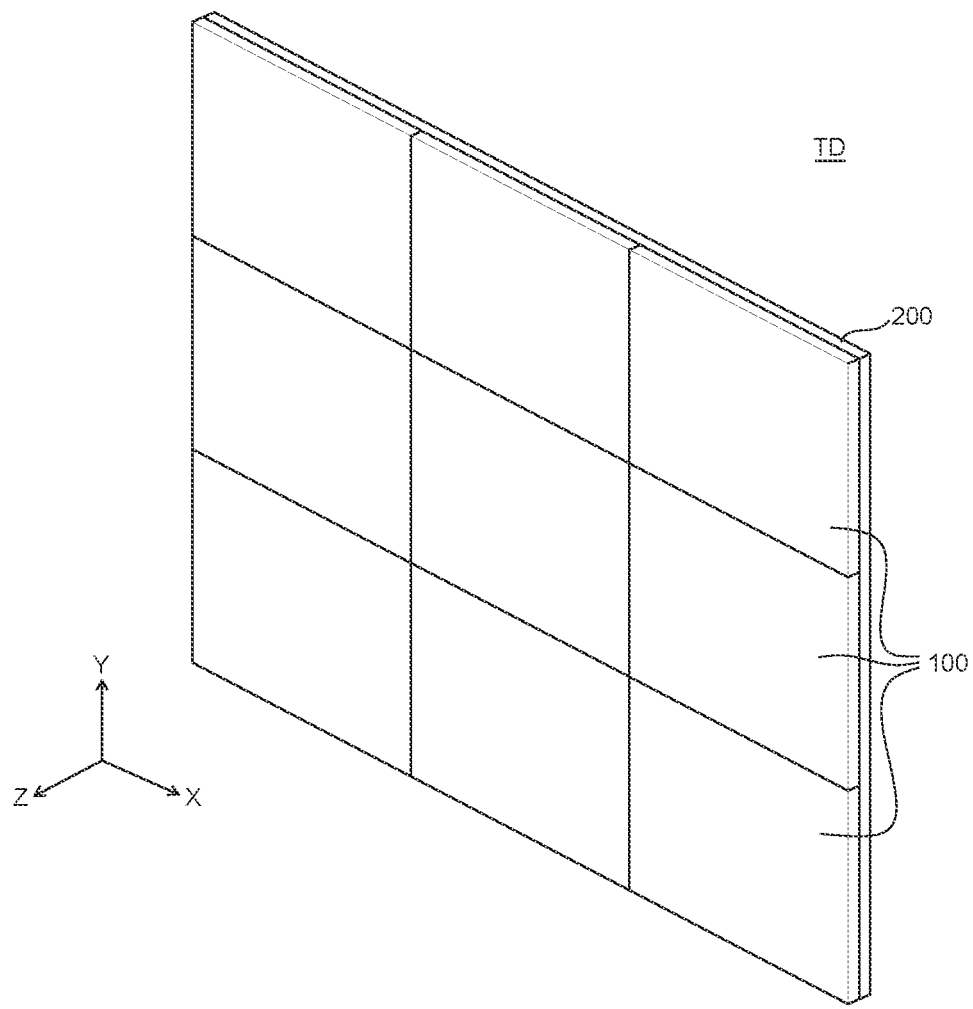
FIG. 1 is a perspective view of a tiling display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a perspective view of a tiling display device according to an embodiment of the present disclosure. Referring to FIG. 1, a tiling display device TD according to an embodiment of the present disclosure is formed by connecting a plurality of display devices 100 according to an embodiment of the present disclosure.

Referring to FIG. 1, the tiling display device TD according to an embodiment of the present disclosure includes the plurality of display devices 100 and a wall part 200. The tiling display device TD is implemented by disposing the plurality of display devices 100 and may allow for enlargement of a display area on which an image is displayed.

Each of the plurality of display devices 100 are attached to the wall part 200 and are arranged like a single display device 100. For example, the tiling display device TD may be implemented by attaching the plurality of display devices 100 to the wall part 200 in the form of tiles. At this time, although not illustrated in the drawings, various lines and cables and the like for electrically connecting each of the plurality of display devices 100 may be disposed on the wall part 200, and the plurality of display devices 100 can be driven like a single display device 100. In addition, the plurality of display devices 100 may be connected by a wireless communication method without separate lines or cables.

Meanwhile, as the tiling display device TD has a very large size, it is difficult to transport the plurality of display devices 100 to an installation location, in a state in which they are connected. Accordingly, after the plurality of display devices 100 are transported to an installation location, the plurality of display devices 100 may be assembled into the tiling display device TD at the installation location.

In addition, when the plurality of display devices 100 are attached to the wall part 200, the plurality of display devices 100 may be attached as closely as possible so that a distance between the plurality of display devices 100 is constant and reduced in order to allow the plurality of display devices 100 to be viewed like one display device 100. That is, by precisely aligning the plurality of display devices 100 and attaching the plurality of display devices 100 to the wall part 200, a boundary area where an image is not displayed can be reduced.

Each of the plurality of display devices 100 may be aligned in an X-axis direction, a Y-axis direction, and a Z-axis direction and attached to the wall part 200. When the plurality of display devices 100 are aligned by moving the plurality of display devices 100 in the X-axis direction, the plurality of display devices 100 may be aligned so that each of left edges and right edges of the plurality of display devices 100 that are disposed in the same columns are disposed in a straight line. Also, when the plurality of display devices 100 are aligned by moving the plurality of display devices 100 in the Y-axis direction, the plurality of display devices 100 may be aligned so that each of upper edges and lower edges of the plurality of display devices 100 that are disposed in the same rows are disposed in a straight line. Also, when aligning the plurality of display devices 100 in the Z-axis direction, an entirety of front surfaces of the plurality of display devices 100 may be aligned to be disposed on a single plane so that a step between the plurality of display devices 100 is removed.

If a misalignment between the plurality of display devices 100 occurs in any one of the X-axis direction, the Y-axis direction, and the Z-axis direction, a boundary area between the plurality of display devices 100 where no image is displayed may be visible by a user. In addition, when the boundary area is visible by a user, it may interfere with immersion when the user views an image, and it may be difficult to implement a clear image.

Accordingly, when attaching the plurality of display devices 100 to the wall part 200, it is important to align the plurality of display devices 100 in each of the X-axis direction, the Y-axis direction, and the Z-axis direction. However, a minute misalignment may occur between the plurality of display devices 100 due to a mechanism tolerance or an error that occurs in a process in which an operator attaches the plurality of display devices 100. In the tiling display device TD according to an embodiment of the present disclosure, in a state in which the plurality of display devices 100 are attached to the wall part 200, even minute misalignments between the plurality of display devices 100 in the X-axis direction and the Y-axis direction can be secondarily aligned.

Figure 2:
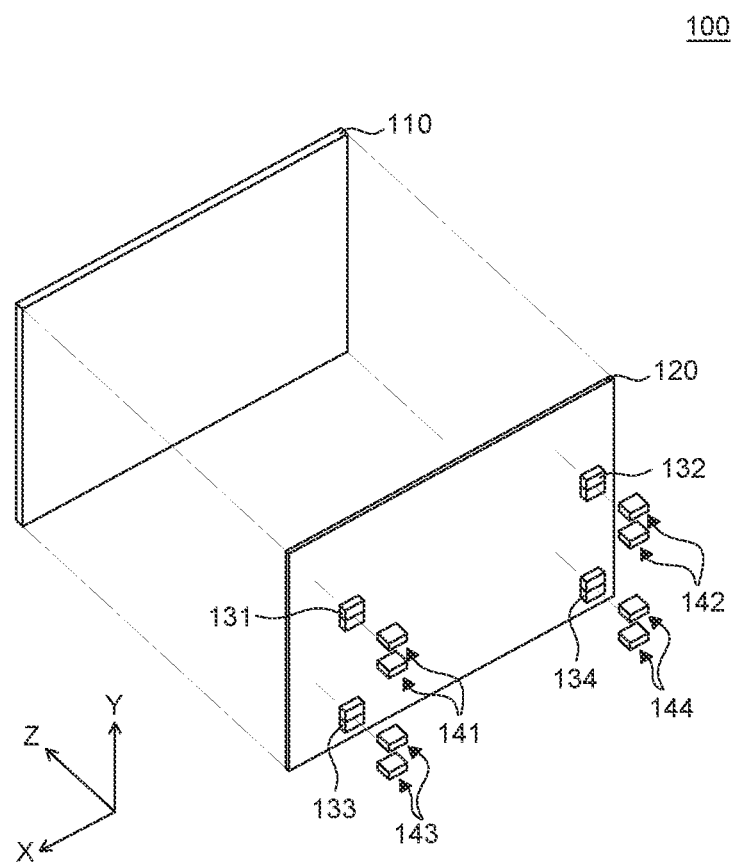
FIG. 2 is an exploded perspective view of a display device according to an embodiment of the present disclosure.
Figure 3:
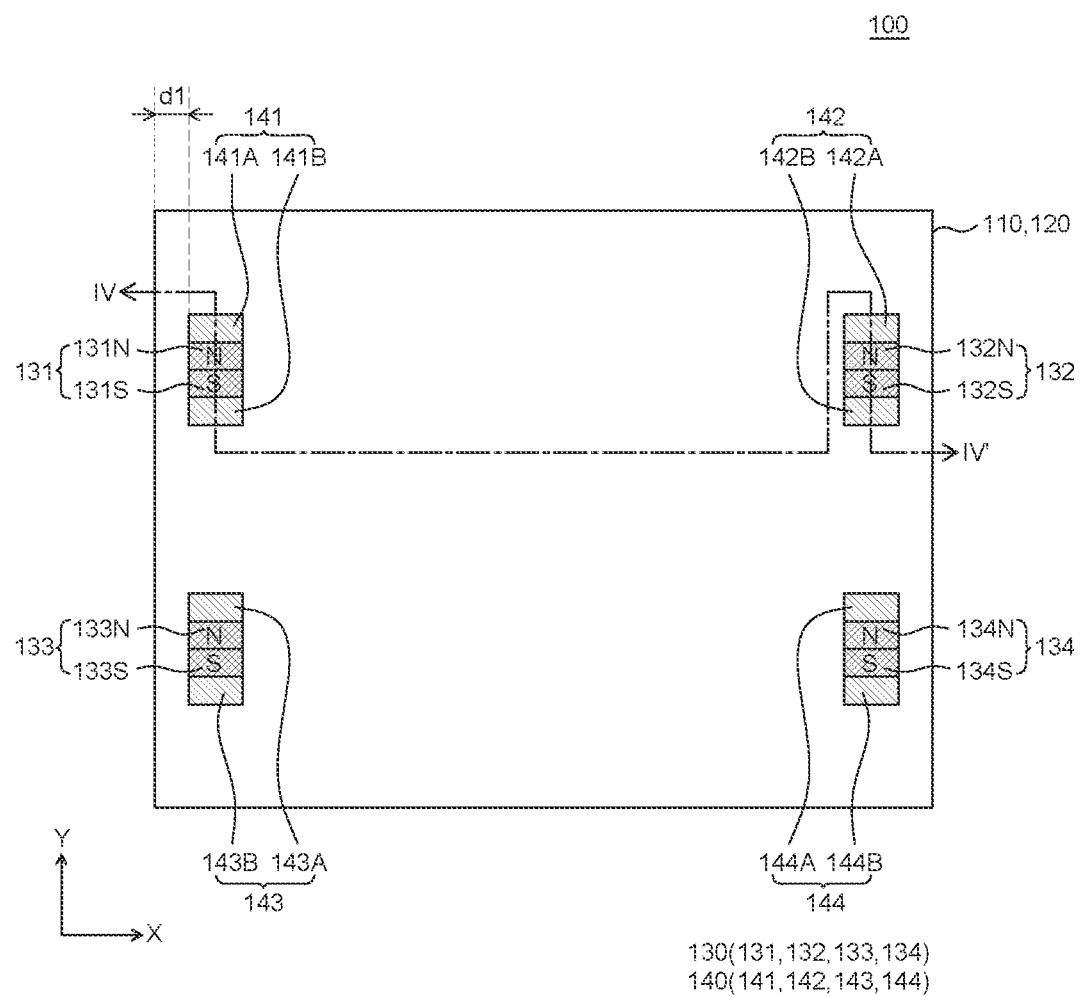
FIG. 3 is a rear view of the display device according to an embodiment of the present disclosure.
Figure 4:
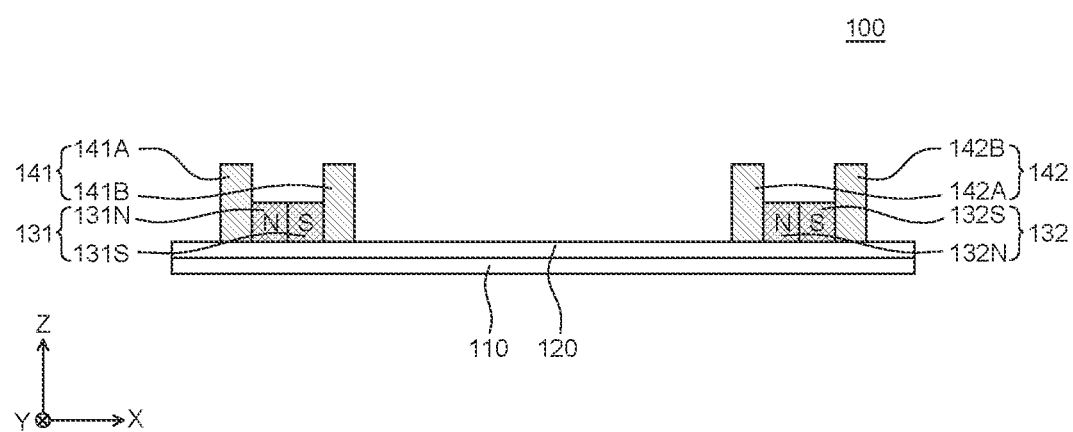
FIG. 4 is a cross-sectional view of the display device taken along IV-IV' of FIG. 3.

FIG. 2 is an exploded perspective view of a display device according to an embodiment of the present disclosure. FIG. 3 is a rear view of the display device according to an embodiment of the present disclosure. FIG. 4 is a cross-sectional view of the display device taken along IV-IV' of FIG. 3. In FIGS. 2 to 4, only one display device 100 among the plurality of display devices 100 of the tiling display device TD is illustrated for convenience of explanation.

Each of the plurality of display devices 100 are components for displaying an image and are basic units constituting the tiling display device TD. Referring to FIG. 2, each of the plurality of display devices 100 includes a display panel 110, a metal plate 120, a plurality of panel magnets 130, and a plurality of panel ferromagnetic bodies 140.

First, the display panel 110 is a component for displaying an image to a user. For example, display elements and circuits, lines and parts and the like for displaying the display elements may be disposed on the display panel 110 to display an image. The display element may be defined differently depending on a type of the display panel 110. For example, when the display panel 110 is an organic light emitting display panel 110, the display element may be an organic light emitting element including an anode, an organic light emitting layer, and a cathode. For example, when the display panel 110 is an inorganic light emitting display panel 110, the display element may be a light emitting diode (LED) or a micro-LED including an n-type semiconductor layer, a p-type semiconductor layer, and a light emitting layer. However, the present disclosure is not limited thereto, and the display element of the display panel 110 may be variously configured.

Referring to FIGS. 2 to 4, the metal plate 120 is disposed on a rear surface of the display panel 110. The metal plate 120 is a component for supporting and protecting the display panel 110 and dissipating heat generated from the display panel 110. The metal plate 120 may be in direct contact with the rear surface of the display panel 110 as illustrated in FIG. 4, and only a portion of the metal plate 120 may be in direct contact with the rear surface of the display panel 110 and another portion thereof may be disposed to be spaced apart from the display panel 110. The metal plate 120 may function as a back cover disposed on the rear surface of the display panel 110, and may be any conductive plate between the display panel 110 and the plurality of panel magnets 130. In FIGS. 2 to 4, the metal plate 120 is illustrated as having the same size as the display panel 110, but the metal plate 120 may have a size smaller than the display panel 110.

Referring to FIGS. 2 to 4, the plurality of panel magnets 130 are disposed on a rear surface of the metal plate 120. The plurality of panel magnets 130 are magnets that are used to attach the display device 100 and a mounting jig 500 or attach the display device 100 and the wall part 200. The plurality of panel magnets 130 may be bar-shaped neodymium (Nd) two-pole magnets including one N-pole and one S-pole, but are not limited thereto. The plurality of panel magnets 130 may be attached to the rear surface of the metal plate 120 with an adhesive layer or may be fixed by a separate fixation device. In addition, the plurality of panel magnets 130 are not directly fixed to the metal plate 120 and may be indirectly fixed to the metal plate 120 in a manner in which they are fixed to the plurality of panel ferromagnetic bodies 140. In FIGS. 2 to 4, although the plurality of panel magnets 130 are illustrated as being disposed to be in contact with the rear surface of the metal plate 120, they are not limited thereto and the plurality of panel magnets 130 may be disposed to be spaced apart from the rear surface of the metal plate 120 and other components may be disposed between the plurality of panel magnets 130 and the metal plate 120. Accordingly, the plurality of panel magnets 130 may be disposed between one ends of the plurality of panel ferromagnetic bodies 140 and the other ends of the plurality of panel ferromagnetic bodies 140 that are in contact with the rear surface of the metal plate 120.

Referring to FIGS. 2 to 4, the plurality of panel magnets 130 includes a first panel magnet 131, a second panel magnet 132, a third panel magnet 133, and a fourth panel magnet 134. Each of the plurality of panel magnets 130 may be disposed adjacent to edges of the display panel 110 and the metal plate 120. For example, the first panel magnet 131 and the third panel magnet 133 may be disposed adjacent to left edges of the display panel 110 and the metal plate 120, and the second panel magnet 132 and the fourth panel magnet 134 may be disposed adjacent to right edges of the display panel 110 and the metal plate 120. In this case, the first panel magnet 131 and the second panel magnet 132 may be disposed side by side in the X-axis direction, and the third panel magnet 133 and the fourth panel magnet 134 may also be disposed side by side in the X-axis direction. That is, the first panel magnet 131 and the second panel magnet 132, and the third panel magnet 133 and the fourth panel magnet 134 may be disposed side by side in a direction substantially parallel to upper edges and lower edges that are long sides of the display panel 110 and the metal plate 120. In addition, the first panel magnet 131 and the third panel magnet 133 may be disposed side by side in the Y-axis direction, and the second panel magnet 132 and the fourth panel magnet 134 may also be disposed side by side in the Y-axis direction. That is, the first panel magnet 131 and the third panel magnet 133, and the second panel magnet 132 and the fourth panel magnet 134 may be disposed side by side in a direction substantially parallel to left edges and right edges that are short sides of the display panel 110 and the metal plate 120. However, the number and arrangement positions of the panel magnets 130 are not limited thereto and may be designed to have magnetism on a level at which the display device 100 can be fixed to the wall part 200 in consideration of sizes, weights and the like of the display panel 110 and the metal plate 120.

Referring to FIG. 3, the panel magnets 130 that are disposed side by side in the X-axis direction may be disposed such that the same polarities thereof are placed side by side. For example, an N-pole 131N of the first panel magnet 131 and an N-pole 132N of the second panel magnet 132 are disposed side by side and an S-pole 131S of the first panel magnet 131 and an S-pole 132S of the second panel magnet 132 are disposed side by side, so that a virtual line connecting the N-pole 131N of the first panel magnet 131 and the N-pole 132N of the second panel magnet 132 does not intersect with and may be substantially parallel to a virtual line connecting the S-pole 131S of the first panel magnet 131 and the S-pole 132S of the second panel magnet 132. In addition, an N-pole 133N of the third panel magnet 133 and an N-pole 134N of the fourth panel magnet 134 are disposed side by side, and an S-pole 133S of the third panel magnet 133 and an S-pole 134S of the fourth panel magnet 134 are disposed side by side, so that a virtual line connecting the N-pole 133N of the third panel magnet 133 and the N-pole 134N of the fourth panel magnet 134 does not intersect with and may be substantially parallel to a virtual line connecting the S-pole 133S of the third panel magnet 133 and the S-pole 134S of the fourth panel magnet 134.

Referring to FIGS. 2 to 4, each of the plurality of panel ferromagnetic bodies 140 is disposed on the rear surface of the metal plate 120 and is disposed on both side surfaces of each of the plurality of panel magnets 130. The plurality of panel ferromagnetic bodies 140 are disposed on two side surfaces facing each other among side surfaces of each of the plurality of panel magnets 130. The plurality of panel ferromagnetic bodies 140 may be formed of various ferromagnetic materials, for example, may be formed of steel, but the material thereof is not limited thereto.

The plurality of panel ferromagnetic bodies 140 includes a first panel ferromagnetic body 141, a second panel ferromagnetic body 142, a third panel ferromagnetic body 143, and a fourth panel ferromagnetic body 144. For example, the first panel ferromagnetic body 141 may be disposed on both side surfaces of the first panel magnet 131, and the second panel ferromagnetic body 142 may be disposed on both side surfaces of the second panel magnet 132. In addition, the third panel ferromagnetic body 143 may be disposed on both side surfaces of the third panel magnet 133, and the fourth panel ferromagnetic body 144 may be disposed on both side surfaces of the fourth panel magnet 134.

In addition, each of the plurality of panel ferromagnetic bodies 140 is formed of a first portion that is in contact with the N-pole of the plurality of panel magnets 130 and a second portion that is in contact with the S-pole of the plurality of panel magnets 130. For example, the first panel ferromagnetic body 141 may include a first portion 141A that is disposed in contact with the N-pole 131N of the first panel magnet 131 and a second portion 141B that is disposed in contact with the S-pole 131S of the first panel magnet 131, and the second panel ferromagnetic body 142 may include a first portion 142A that is disposed in contact with the N-pole 132N of the second panel magnet 132 and a second portion 142B that is disposed in contact with the S-pole 132S of the second panel magnet 132. In addition, the third panel ferromagnetic body 143 may include a first portion 143A that is disposed in contact with the N-pole 133N of the third panel magnet 133 and a second portion 143B that is disposed in contact with the S-pole 133S of the third panel magnet 133, and the fourth panel ferromagnetic body 144 may include a first portion 144A that is disposed in contact with the N-pole 134N of the fourth panel magnet 134 and a second portion 144B that is disposed in contact with the S-pole 134S of the fourth panel magnet 134.

Referring to FIG. 3, a distance dl between each of the plurality of panel magnets 130 and the left edges and right edges of the display panel 110 and the metal plate 120 may be 100 mm or less. When the wall part 200 has a curved shape, even if the plurality of display panels 110 are aligned as closely as possible, a separation space between the display panels 110 may be generated due to a step in the wall part 200. The display device 100 and the wall part 200 are attached by the panel magnets 130 and the panel ferromagnetic bodies 140, and when the panel magnets 130 and the panel ferromagnetic bodies 140 are excessively spaced apart from the left edges and the right edges, the display panels 110 are spaced apart from each other in the Z-axis direction, so that a separation space between the display panels 110 may occur and the corresponding space can be visible to a user. Accordingly, by making the distance dl between each of the plurality of panel magnets 130 and the left edges and right edges of the display panel 110 and the metal plate 120 to be 100 mm or less, it is possible to reduce occurrence of the separation space between the display panels 110.

Hereinafter, prior to explaining a process of tiling the display devices 100 described with reference to FIGS. 2 to 4, FIGS. 5A to 5C are referred together for explaining the mounting jig 500 that can be used at the time of tiling.

Figure 5A:
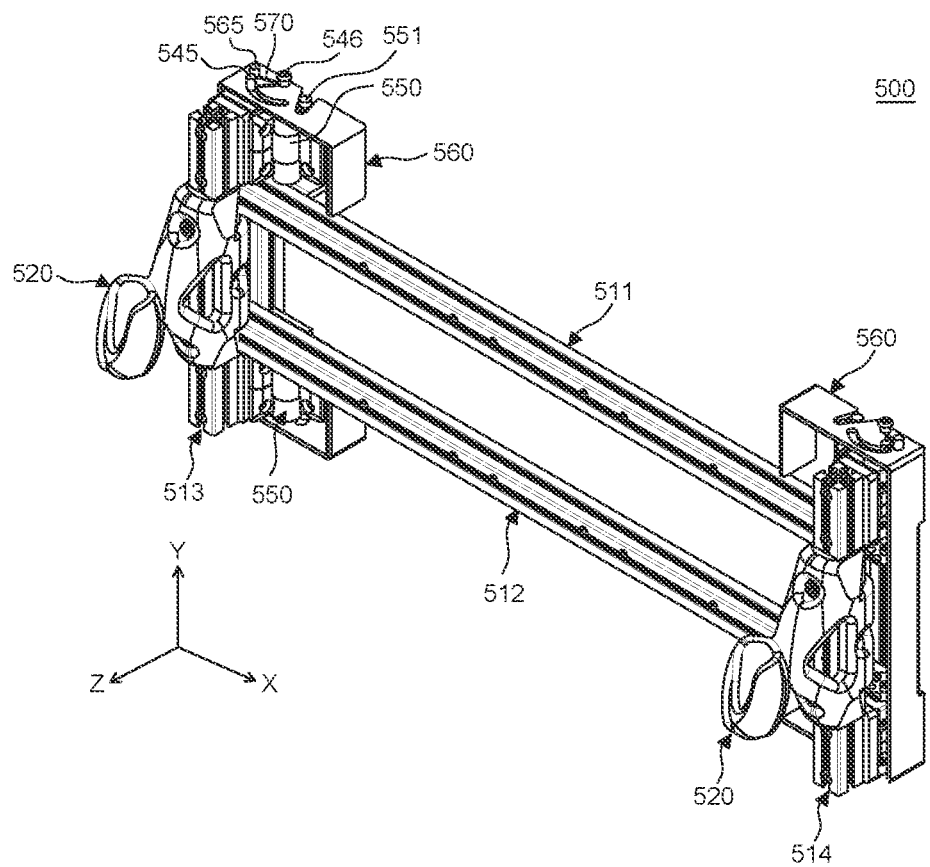
FIGS. 5A to 5C are perspective views for explaining a mounting jig used in a manufacturing method of a tiling display device according to an embodiment of the present disclosure.
Figure 5B:
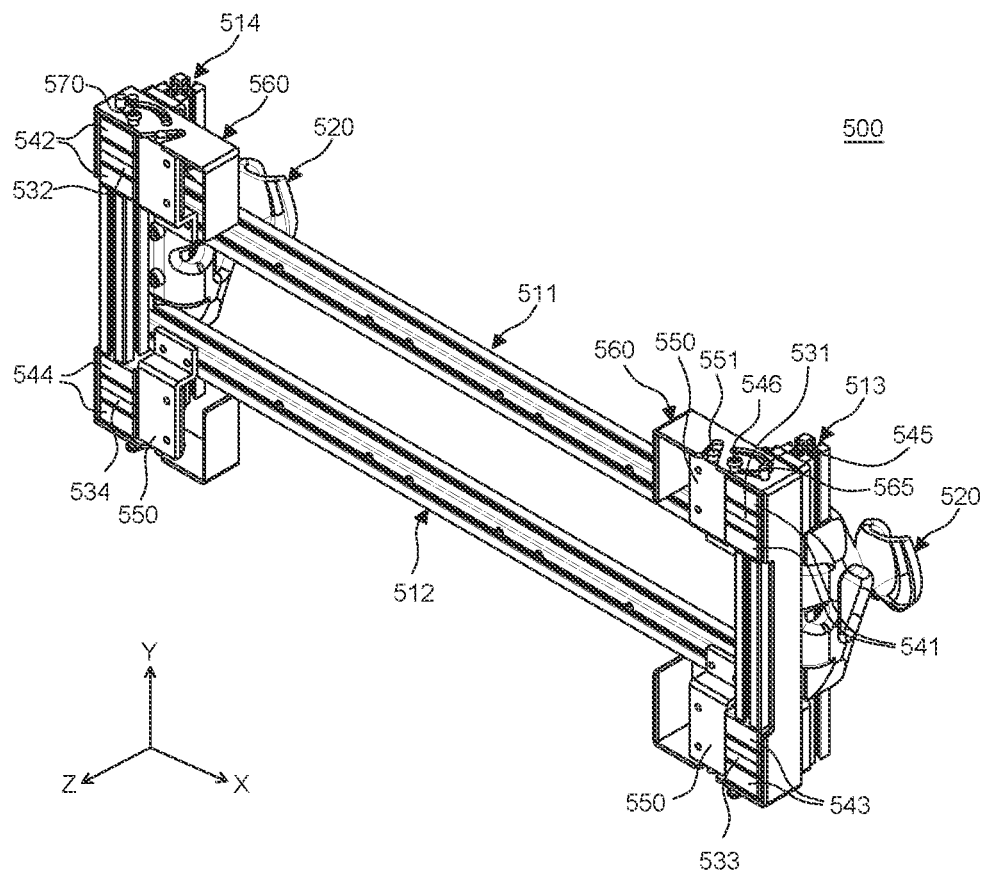
Figure 5C:
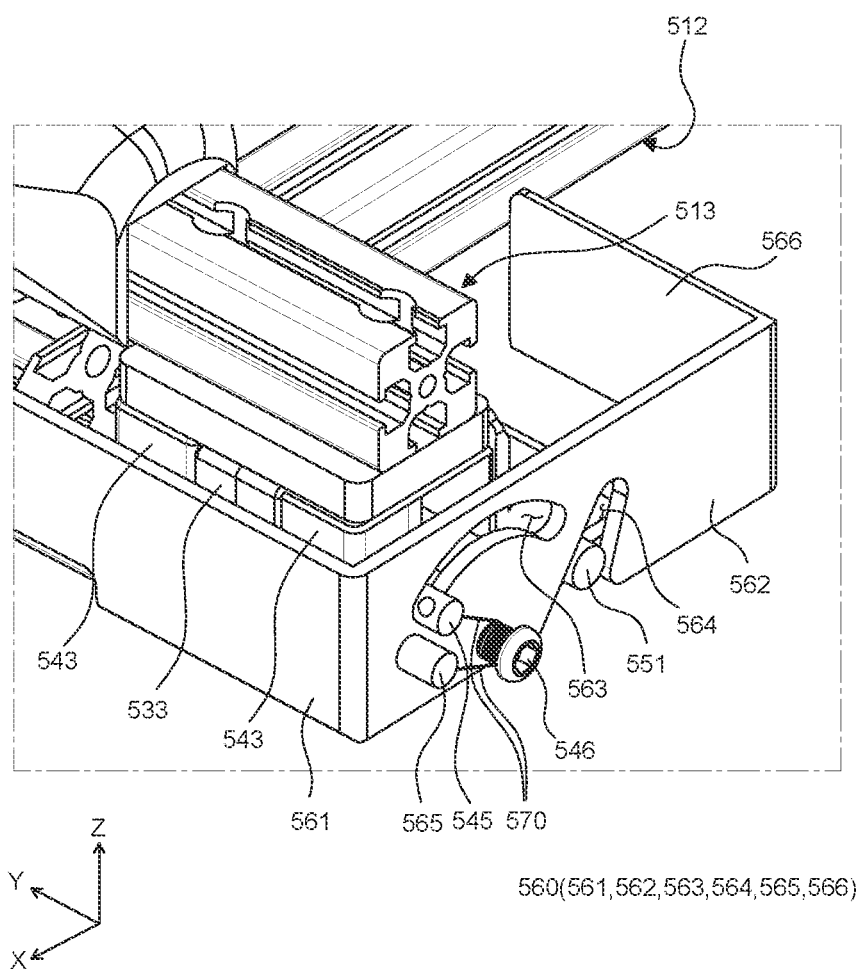

FIGS. 5A to 5C are perspective views for explaining a mounting jig used in a manufacturing method of a tiling display device according to an embodiment of the present disclosure. FIG. 5A is a perspective view seen from front and side views, and FIG. 5B is a perspective view seen from rear and side views. FIG. 5C is an enlarged perspective view illustrating a third jig magnet 533 and a third jig ferromagnetic body 543 among a plurality of jig magnets 530 and a plurality of jig ferromagnetic bodies 540 and a guard rail 560.

Referring to FIGS. 5A to 5C, the mounting jig 500 includes supporting members 510, handles 520, hinge structures 550, the plurality of jig magnets 530, the plurality of jig ferromagnetic bodies 540, guard rails 560, and elastic members 570.

The supporting members 510 of the mounting jig 500 are structures for supporting the mounting jig 500 and may be implemented in a form of frames. For example, the supporting members 510 may support the plurality of jig magnets 530, the plurality of jig ferromagnetic bodies 540, the hinge structures 550, the handles 520, and the like. The supporting members 510 include a first supporting member 511, a second supporting member 512, a third supporting member 513, and a fourth supporting member 514.

The first supporting member 511 and the second supporting member 512 are supporting members 510 extending in the X-axis direction, and the third supporting member 513 and the fourth supporting member 514 are supporting members 510 extending in the Y-axis direction. The first supporting member 511, the second supporting member 512, the third supporting member 513, and the fourth supporting member 514 may be formed of a material having rigidity, for example, may be formed of a metallic material, a plastic material or the like, but is not limited thereto. Meanwhile, in FIGS. 5A to 5C, the mounting jig 500 is described as being formed of four supporting members 510 extending in the X-axis direction or Y-axis direction, but supporting members for supporting the mounting jig 500 are not limited thereto.

Referring to FIGS. 5A to 5C, the handles 520 for an operator to grasp the mounting jig 500 and perform an operation are fixed to the third supporting member 513 and the fourth supporting member 514. The operator may align and attach the mounting jig 500 to the display device 100, and freely align the display device 100 in a process of tiling the display device 100, by using the handles 520 fixed to the third supporting member 513 and the fourth supporting member 514. However, shapes of the handles 520 are not limited to shapes illustrated in FIGS. 5A to 5C and may be freely determined.

The plurality of jig magnets 530 may be fixed to the supporting members 510. For example, the plurality of jig magnets 530 may be fixed to the third supporting member 513 and the fourth supporting member 514 of the supporting members 510. The plurality of jig magnets 530 are magnets used to attach the display device 100 and the mounting jig 500. The plurality of jig magnets 530 may be bar-shaped neodymium (Nd) two-pole magnets including one N-pole and one S-pole, but are not limited thereto. The plurality of jig magnets 530 may be fixed to the supporting members 510 with an adhesive layer, or may be fixed by a separate fixing mechanism. In addition, the plurality of jig magnets 530 may not be directly fixed to the supporting members 510, and may be indirectly fixed to the supporting members 510 in such a manner that they are fixed to the plurality of jig ferromagnetic bodies 540. Accordingly, the plurality of jig magnets 530 may be disposed between one ends of the plurality of jig ferromagnetic bodies 540 and the other ends of the plurality of jig ferromagnetic bodies 540 that face the rear surface of the metal plate 120.

The plurality of jig magnets 530 includes a first jig magnet 531, a second jig magnet 532, a third jig magnet 533, and a fourth jig magnet 534. The first jig magnet 531 and the third jig magnet 533 may be fixed to the third supporting member 513, and the second jig magnet 532 and the fourth jig magnet 534 may be fixed to the fourth supporting member 514. At this time, the first jig magnet 531 and the second jig magnet 532 may be disposed side by side in the X-axis direction, and the third jig magnet 533 and the fourth jig magnet 534 may also be disposed side by side in the X-axis direction. In addition, the first jig magnet 531 and the third jig magnet 533 may be disposed side by side in the Y-axis direction, and the second jig magnet 532 and the fourth jig magnet 534 may also be disposed side by side in the Y-axis direction. However, the number and arrangement of the jig magnets 530 are not limited thereto, and may be designed to correspond to the number and arrangement of the panel magnets 130 disposed in the display device 100.

When the mounting jig 500 is attached to the display device 100, the jig magnets 530 may be disposed so that polarities of the jig magnets 530 correspond to polarities of the panel magnets 130. As will be described later, since the mounting jig 500 and the display device 100 are attached using magnetic force of the jig magnets 530 and the panel magnets 130, the jig magnets 530 and the panel magnets 130 that will overlap each other may be designed to have opposite polarities. For example, the first jig magnet 531 may be disposed so that an N-pole of the first jig magnet 531 corresponds to the S-pole 131S of the first panel magnet 131 and an S-pole of the first jig magnet 531 corresponds to the N-pole 131N of the first panel magnet 131.

The plurality of jig ferromagnetic bodies 540 are fixed to the third supporting member 513 and the fourth supporting member 514 together with the plurality of jig magnets 530. The plurality of jig ferromagnetic bodies 540 are disposed on both side surfaces of each of the plurality of jig magnets 530. Each of the plurality of jig ferromagnetic bodies 540 is disposed on two side surfaces facing each other among side surfaces of each of the jig magnets 530. A portion of the plurality of jig ferromagnetic bodies 540 may be disposed to be in contact with each of S-poles of the plurality of jig magnets 530, and a remainder portion of the plurality of jig ferromagnetic bodies 540 may be disposed to be in contact with each of N-poles of the plurality of jig magnets 530. The plurality of jig ferromagnetic bodies 540 may be formed of various ferromagnetic materials, for example, may be formed of steel, but are not limited thereto.

The plurality of jig ferromagnetic bodies 540 include a first jig ferromagnetic body 541, a second jig ferromagnetic body 542, a third jig ferromagnetic body 543, and a fourth jig ferromagnetic body 544. For example, the first jig ferromagnetic body 541 and the third jig ferromagnetic body 543 may be fixed to the third supporting member 513 so that the first jig ferromagnetic body 541 is disposed on both side surfaces of the first jig magnet 531 and the third jig ferromagnetic body 543 is disposed on both side surfaces of the third jig magnet 533. And, the second jig ferromagnetic body 542 and the fourth jig ferromagnetic body 544 may be fixed to the fourth supporting member 514 so that the second jig ferromagnetic body 542 is disposed on both side surfaces of the second jig magnet 532 and the fourth jig ferromagnetic body 544 is disposed on both side surfaces of the fourth jig magnet 534.

And, each of the plurality of jig ferromagnetic bodies 540 are configured of first portions in contact with N-poles of the plurality of jig magnets 530 and second portions in contact with S-poles of the plurality of jig magnets 530. For example, the first jig ferromagnetic body 541 may include a first portion disposed to be in contact with the N-pole of the first jig magnet 531 and a second portion disposed to be in contact with the S-pole of the first jig magnet 531, and the second jig ferromagnetic body 542 may include a first portion disposed to be in contact with the N-pole of the second jig magnet 532 and a second portion disposed to be in contact with the S-pole of the second jig magnet 532. And, the third jig ferromagnetic body 543 may include a first portion disposed to be in contact with the N-pole of the third jig magnet 533 and a second portion disposed to be in contact with the S-pole of the third jig magnet 533, and the fourth jig ferromagnetic body 544 may include a first portion disposed in contact with the N-pole of the fourth jig magnet 534 and a second portion disposed in contact with the S-pole of the fourth jig magnet 534.

Meanwhile, although the mounting jig 500 is illustrated as including the plurality of jig ferromagnetic bodies 540 in FIGS. 5A to 5C, the plurality of jig ferromagnetic bodies 540 may be omitted. In this manner, when the plurality of jig ferromagnetic bodies 540 are omitted, a size of each of the plurality of jig magnets 530 may be designed to correspond to the sum of sizes of each of the plurality of panel magnets 130 and each of the plurality of panel ferromagnetic bodies 140.

Ferromagnetic protrusions 545 that protrude toward the guard rails 560 are disposed on at least some of the plurality of jig ferromagnetic bodies 540. The ferromagnetic protrusions 545 protruding from some ferromagnetic bodies that face second plates 562 of the guard rails among the plurality of jig ferromagnetic bodies 540 may be disposed. The ferromagnetic protrusions 545 may be disposed to protrude from the jig ferromagnetic bodies 540 that are adjacent to both ends of the third supporting member 513 and both ends of the fourth supporting member 514 among the plurality of jig ferromagnetic bodies 540. The ferromagnetic protrusions 545 may be inserted into first guide parts 563 of the second plates 562 of the guard rails 560, and may slide along the first guide parts 563 when the mounting jig 500 is used. This will be described later with reference to FIGS. 6A to 6J.

Supporting shafts 546 that protrude toward the guard rails 560 are disposed on at least some of the plurality of jig ferromagnetic bodies 540. The supporting shafts 546 protruding toward the second plates 562 may be disposed on some jig ferromagnetic bodies 540 that face the second plates 562 of the guard rails among the plurality of jig ferromagnetic bodies 540. The supporting shafts 546 may be disposed to protrude in a direction in which the third supporting member 513 extends from the jig ferromagnetic bodies 540 that are adjacent to both ends of the third supporting member 513 and both ends of the fourth supporting member 514 among the plurality of jig ferromagnetic bodies 540. For example, the supporting shafts 546 may be disposed to protrude in the Y-axis direction from some of the plurality of jig ferromagnetic bodies 540. The supporting shafts 546 may be inserted into through holes of the guard rails 560, and may function as rotation shafts of the guard rails 560 when the mounting jig 500 is used. This will be described later with reference to FIGS. 6A to 6J.

Meanwhile, a shape and a structure of the mounting jig 500 used in a manufacturing method of the tiling display device 100 according to an embodiment of the present disclosure are not limited to those in FIGS. 5A to 5C, and the mounting jig 500 can be designed in various shapes and structures, as long as the jig magnets 530 that are disposed to correspond to the panel magnets 130 and the jig ferromagnetic bodies 540 that are disposed on both sides of the jig magnets 530 are used.

Referring to FIGS. 5A to 5C, the hinge structures 550 are fixed to the first supporting member 511, the second supporting member 512, the third supporting member 513, and the fourth supporting member 514. The hinge structures 550 are structures configured such that the operator can rotate the handles 520 in directions of arrows illustrated in FIG. 6C and FIG. 7C while grasping the handles 520. Specifically, the handle 520 on a left side may rotate inwardly through the hinge structures 550 that are respectively fixed between the first supporting member 511 and the third supporting member 513 and between the second supporting member 512 and the third supporting member 513, and the handle 520 on a right side may rotate inwardly through the hinge structures 550 that are respectively fixed between the first supporting member 511 and the fourth supporting member 514 and between the second supporting member 512 and the fourth supporting member 514. Through such a hinge structure 550, the operator may more easily detach and attach the jig magnets 530 of the mounting jig 500 and the panel magnets 130 of the display device 100.

Hinge protrusions 551 that protrude from the hinge structures 550 toward the guard rails 560 are disposed. The hinge protrusions 551 may protrude toward the second plates 562 of the guard rails 560 and be inserted into second guide parts 564 of the guard rails 560. When the mounting jig 500 is used, a rotation direction of the guard rail 560 may be guided by the hinge protrusion 551 that is inserted into the second guide part 564, which will be described later with reference to FIGS. 6A to 6J.

The guard rails 560 that rotate in response to rotation of the plurality of jig magnets 530 and reduce damage capable of occurring in the display device 100 during attachment and detachment are disposed. The guard rails 560 may be disposed to surround the plurality of jig magnets 530. For example, the guard rail 560 disposed on the left side among the guard rails 560 may be disposed to surround the third supporting member 513 and the first jig magnet 531 and the third jig magnet 533 that are fixed to the third supporting member 513, and the guard rail 560 disposed on the right side may be disposed to surround the fourth supporting member 514 and the second jig magnet 532 and the fourth jig magnet 534 that are fixed to the fourth supporting member 514.

The guard rails 560 may be rotatably connected to the supporting shafts 546 of the plurality of jig ferromagnetic bodies 540 fixed to the plurality of jig magnets 530. Specifically, the guard rail 560 on the left side may be rotatably connected to the supporting shafts 546 of the first jig ferromagnetic body 541 and the third jig ferromagnetic body 543 fixed to the third supporting member 513, and the guard rail 560 disposed on the right side may be rotatably connected to the supporting shafts 546 of the second jig ferromagnetic body 542 and the fourth jig ferromagnetic body 544 fixed to the fourth supporting member 514.

The guard rail 560 includes a first plate 561, the second plates 562, and third plates 566.

The first plate 561 is a portion extending in a direction in which the third supporting member 513 and the fourth supporting member 514 extend. The first plate 561 is a portion extending in the Y-axis direction to correspond to each of the third supporting member 513 and the fourth supporting member 514. For example, the first plate 561 of the guard rail 560 on the left side may extend in the Y-axis direction and may be disposed to correspond to the third supporting member 513, and the first plate 561 of the guard rail 560 on the right side may extend in the Y-axis direction and may be disposed to correspond to the fourth supporting member 514. The first plate 561 of the guard rail 560 on the left side may be disposed on the outside of the third supporting member 513 and may face the first jig magnet 531, the first jig ferromagnetic body 541, the third jig magnet 533, and the third jig ferromagnetic body 543. The first plate 561 of the guard rail 560 on the right side may be disposed on the outside of the fourth supporting member 514 and may face the second jig magnet 532, the second jig ferromagnetic body 542, the fourth jig magnet 534, and the fourth jig ferromagnetic body 544.

The second plates 562 are portions extending in a direction in which the first supporting member 511 and the second supporting member 512 extend from both ends of the first plate 561. The second plates 562 may extend from both ends of the first plate 561 in the X-axis direction and be disposed to correspond to the third supporting member 513 and the fourth supporting member 514. For example, the second plates 562 of the guard rail 560 on the left side may extend from both ends of the first plate 561 in the X-axis direction and may be disposed to face the first jig ferromagnetic body 541 and the third jig ferromagnetic body 543. The second plates 562 of the guard rail 560 on the right side may extend from both ends of the first plate 561 in the X-axis direction and may be disposed to face the second jig ferromagnetic body 542 and the fourth jig ferromagnetic body 544.

A through hole is disposed in the second plate 562. The through hole is a hole into which the supporting shaft 546 protruding from at least a portion of the plurality of jig ferromagnetic bodies 540 is inserted. The guard rail 560 may be rotatably connected to the plurality of jig magnets 530 and the plurality of jig ferromagnetic bodies 540 in such a manner that the supporting shaft 546 is inserted into the through hole. The guard rail 560 may rotate about the supporting shaft 546 inserted into the through hole.

The first guide part 563 is disposed in the second plate 562. The first guide part 563 is a hole into which the ferromagnetic protrusion 545 protruding from at least a portion of the plurality of jig ferromagnetic bodies 540 is inserted. The ferromagnetic protrusion 545 may be inserted into the first guide part 563 and slide along the first guide part 563. The first guide part 563 may have a shape corresponding to a rotation path of the guard rail 560 and the plurality of jig ferromagnetic bodies 540. Meanwhile, when the ferromagnetic protrusion 545 is disposed at any one end of the first guide part 563, the rotation direction of the guard rail 560 may be guided according to rotation of the handle 520 and the jig ferromagnetic bodies 540, which will be described later with reference to FIGS. 6A to 6J.

The second guide part 564 is disposed in the second plate 562. The second guide part 564 is a groove into which the hinge protrusion 551 of the hinge structure 550 is inserted. One end of the second guide part 564 may be in communication with the outside of the second plate 562, and the other end of the second guide part 564 may be disposed within the second plate 562. Accordingly, when the mounting jig 500 is used, the hinge protrusion 551 may move toward an inside or the outside of the second plate 562 through one end of the second guide part 564, and when the hinge protrusion 551 moves to an inside of the second guide part 564, it may slide along the second guide part 564. Meanwhile, when the hinge protrusion 551 is inserted into the second guide part 564, the rotation direction of the guard rail 560 may be guided, which will be described later with reference to FIGS. 6A to 6J.

A fixing part 565 is disposed on the second plate 562. The fixing part 565 is a part to which the elastic member 570, which will be described later, is fixed, and may be disposed on a surface opposite to a surface of the second plate 562 facing the jig ferromagnetic body 540. The fixing part 565 may be disposed adjacent to an end adjacent to the first plate 561 among both ends of the first guide part 563, but is not limited thereto.

The third plates 566 are portions extending from one ends of the second plates 562 toward the first supporting member 511 and the second supporting member 512. The third plates 566 are portions extending in the direction in which the third supporting member 513 and the fourth supporting member 514 extend. The third plate 566 may extend from one end of the second plate 562 in the Y-axis direction. For example, the third plates 566 of the guard rail 560 on the left side may be disposed to extend from one ends of the second plates 562 toward the first supporting member 511 and the second supporting member 512, and the third plates 566 of the guard rail 560 on the right side may be disposed to extend from one ends of the second plates 562 toward the first supporting member 511 and the second supporting member 512. At this time, the third plates 566 extend toward the first supporting member 511 and the second supporting member 512, but in order to prevent the third plates 566 from being caught with the supporting members 510 when the guard rail 560 rotates, they may be disposed to be spaced apart from the first supporting member 511 and the second supporting member 512.

The elastic member 570 is disposed on the second plate 562 of the guard rail 560. The elastic member 570 has one end that is connected to the ferromagnetic protrusion 545 and the other end that is connected to the fixing part 565. In addition, an intermediate point between one end and the other end of the elastic member 570 is connected to the supporting shaft 546. The elastic member 570 has an elastic force that spaces one end of the elastic member 570 and the other end of the elastic member 570 from each other. Accordingly, to the ferromagnetic protrusion 545 and the fixing part 565, a force from the elastic member 570 that space them from each other may be applied.

Meanwhile, the guard rail 560 is a safety device for preventing the mounting jig 500 from being suddenly attached to the display device 100 due to attractive forces between the jig magnets 530 and the panel magnets 130, or preventing the display device 100 attached to the wall part 200 from being lifted by the mounting jig 500, when the mounting jig 500 is used. When the mounting jig 500 is attached to the display device 100, the guard rail 560 may protect the display device 100 so that the mounting jig 500 is not attached to the display device 100 while giving a strong impact to the display device 100. The guard rail 560 prevents the display device 100 from being lifted or detached from the wall part 200 when the mounting jig 500 is detached from the display device 100, so that the display device 100 and the mounting jig 500 can be easily separated. Hereinafter, FIGS. 6A to 6J are referred together for a more detailed description of a manufacturing method of the tiling display device TD using the mounting jig 500 including the guard rail 560.

FIGS. 6A to 6J are cross-sectional views for explaining a manufacturing method of a tiling display device according to an embodiment of the present disclosure. Specifically, FIGS. 6A, 6E, 6F, and 6G are schematic cross-sectional views of the display device 100 and the mounting jig 500 during a manufacturing process of the tiling display device TD. FIGS. 6B to 6D and FIGS. 6H to 6J are cross-sectional views of the second jig magnet 532 and the second jig ferromagnetic body 542 of the mounting jig 500 during the manufacturing process of the tiling display device TD. Although FIGS. 6A, 6E, 6F, and 6G illustrate the first jig magnet 531, the first jig ferromagnetic body 541, the second jig magnet 532, and the second jig ferromagnetic body 542 that correspond to the first panel magnet 131, the first panel ferromagnetic body 141, the second panel magnet 132, and the second panel ferromagnetic body 142 of the display device 100 among various components of the mounting jig 500 for convenience of explanation, the same principle can be applied to the third jig magnet 533, the third jig ferromagnetic body 543, the fourth jig magnet 534, and the fourth jig ferromagnetic body 544 that correspond to the third panel magnet 133, the third panel ferromagnetic body 143, the fourth panel magnet 134, and the fourth panel ferromagnetic body 144 of the display device 100.

Figure 6A:
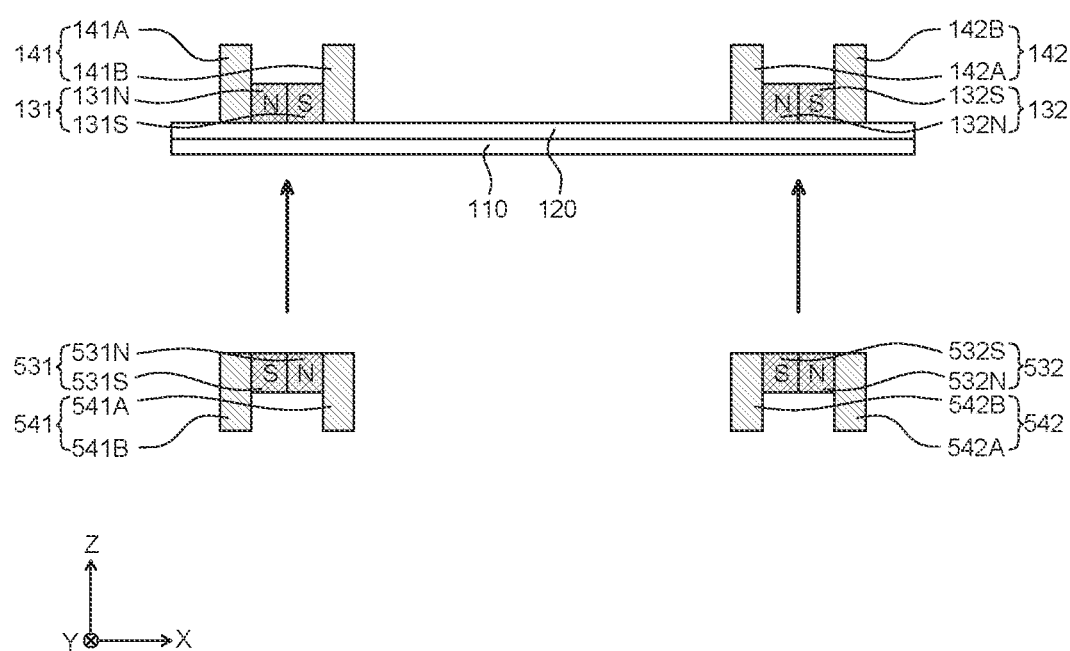
FIGS. 6A to 6J are cross-sectional views for explaining a manufacturing method of a tiling display device according to an embodiment of the present disclosure.

First, referring to FIG. 6A, the mounting jig 500 is attached to the front surface of the display device 100. In this case, the mounting jig 500 may be attached to the front surface of the display device 100 by positioning the first jig magnet 531, the first jig ferromagnetic body 541, the second jig magnet 532, and the second jig ferromagnetic body 542 of the mounting jig 500 to correspond to the first panel magnet 131, the first panel ferromagnetic body 141, the second panel magnet 132, and the second panel ferromagnetic body 142, respectively.

At this time, when the mounting jig 500 is disposed adjacent to the display device 100, the mounting jig 500 may be suddenly attached to the front surface of the display device 100 due to attractive forces between the jig magnets 530 of the mounting jig 500 and the panel magnets 130 of the display device 100. In this case, the mounting jig 500 may be attached to the display device 100 while giving an impact thereto, and may lead to damage to the display device 100. Accordingly, the mounting jig 500 and the display device 100 may be attached so that the mounting jig 500 can be attached to the front surface of the display device 100 without giving an impact thereto by disposing the mounting jig 500 in a first state on the front surface of the display device 100 and sequentially changing the mounting jig 500 from the first state to a second state and from the second state to a third state.

Figure 6B:
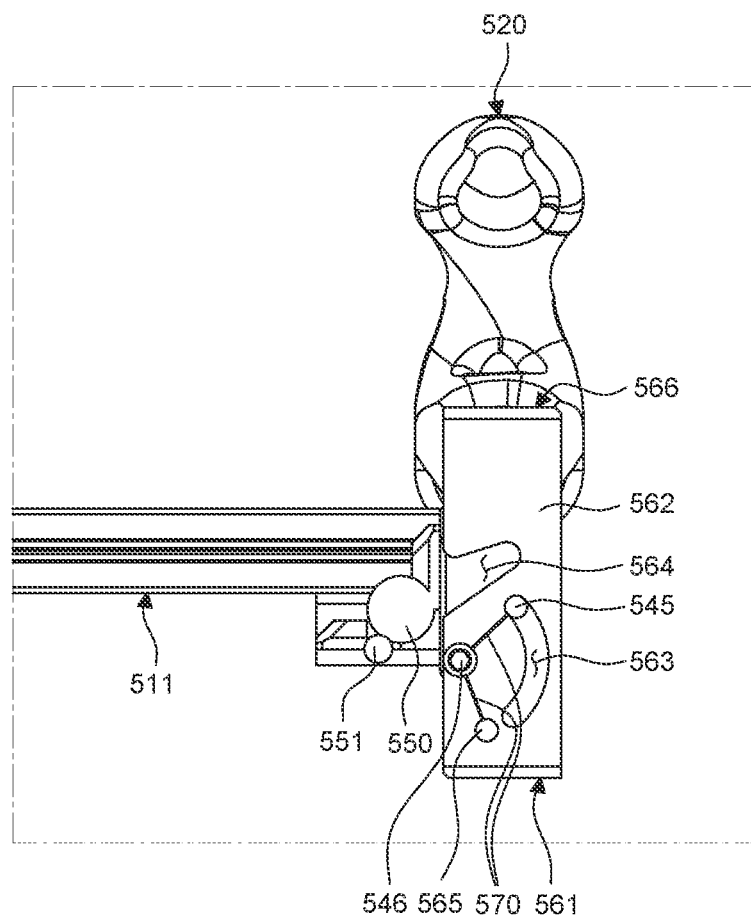

First, referring to FIG. 6B, before attaching the mounting jig 500 to the front surface of the display device 100, the mounting jig 500 may be disposed in the first state. The first state is a state in which a safety distance between the jig magnets 530 of the mounting jig 500 and the panel magnets 130 of the display device 100 can be secured, and may prevent the mounting jig 500 from being suddenly attached to the front surface of the display device 100 while giving a strong impact thereto due to attractive forces.

Specifically, the first state is a state in which the first plate 561 of the guard rail 560 is disposed to face the front surface of the display device 100. In the first state, the first plate 561 of the guard rail 560 may be disposed between the display device 100 and the jig magnet 530 to ensure a safety distance between the jig magnet 530 and the panel magnet 130. That is, when the mounting jig 500 in the first state is attached to the display device 100, the first plate 561 of the guard rail 560 merely comes in contact with the display device 100, and the jig magnet 530 may maintain a state in which it is spaced apart from the display device 100.

In the first state, the ferromagnetic protrusion 545 may be disposed at an end adjacent to the third plate 566 among the both ends of the first guide part 563. At this time, the ferromagnetic protrusion 545 may be disposed at the end of the first guide part 563 adjacent to the third plate 566 due to the elastic force of the elastic member 570 that spaces one end and the other end thereof from each other, and may maintain a state in which it is spaced apart as far as possible from the fixing part 565.

Figure 6C:
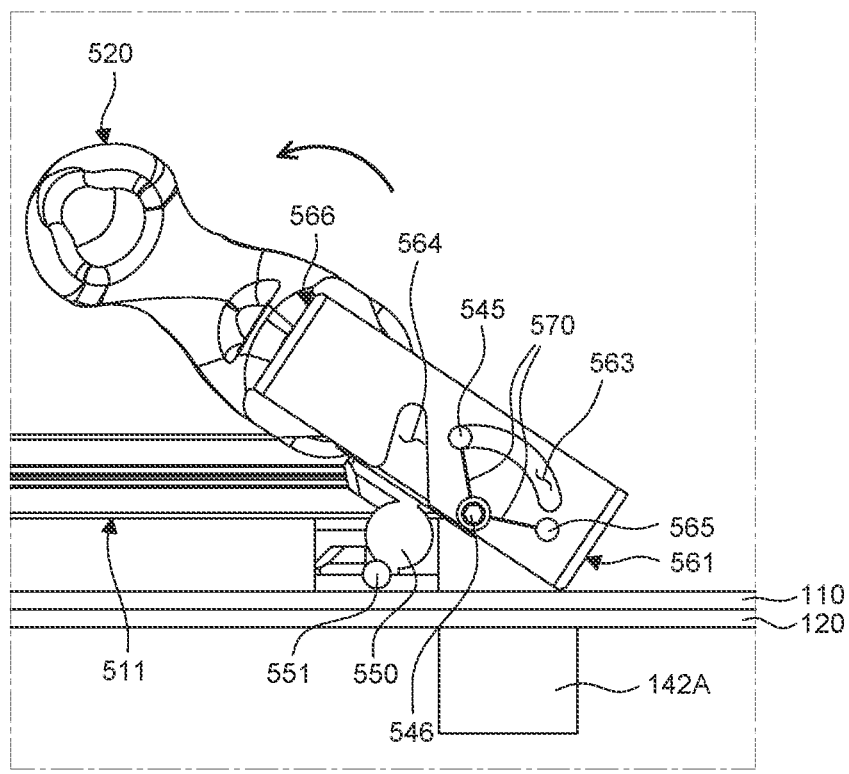

Next, referring to FIG. 6C, by changing the mounting jig 500 from the first state to the second state, the hinge structure 550 may be attached to the front surface of the display device 100 while securing a safety distance between the jig magnet 530 and the panel magnet 130.

By rotating the handle 520 toward an inside of the mounting jig 500 in the mounting jig 500 in the first state, the mounting jig 500 may be changed to the second state. Specifically, the handle 520 on the left side that is fixed to the third supporting member 513 may be rotated toward the fourth supporting member 514, and the handle 520 on the right side that is fixed to the fourth supporting member 514 may be rotated toward the third supporting member 513.

And, the third supporting member 513 that is fixed to the handle 520 disposed on the left side, and the first jig magnet 531 and the third jig magnet 533 that are fixed to the third supporting member 513 may rotate together with the handle 520 on the left side, based on the hinge structure 550, and the fourth supporting member 514 that is fixed to the handle 520 on the right side, and the second jig magnet 532 and the fourth jig magnet 534 that are fixed to the fourth supporting member 514 may rotate together with the handle 520 on the right side, based on the hinge structure 550. For example, the first jig magnet 531 and the third jig magnet 533 may rotate toward an outside of the mounting jig 500 while being in a line with the handle 520 on the left side, and the second jig magnet 532 and the fourth jig magnet 534 may rotate toward the outside of the mounting jig 500 while being in a line with the handle 520 on the right side.

In this case, the guard rail 560 disposed such that the front surface of the display device 100 and the first plate 561 face each other may also rotate in response to the rotation of the jig magnet 530. In the first state, the ferromagnetic protrusion 545 is disposed at the end adjacent to the third plate 566 among the both ends of the first guide part 563. And, when the mounting jig 500 is switched from the first state to the second state, the plurality of jig ferromagnetic bodies 540 may rotate toward the outside of the mounting jig 500 based on the hinge structure 550, in a direction away from the front surface of the display device 100. And, the ferromagnetic protrusion 545 and the supporting shaft 546 protruding from the jig ferromagnetic body 540 may also rotate toward the outside of the mounting jig 500 based on the hinge structure 550, in a direction away from the front surface of the display device 100. Accordingly, when the handle 520 is rotated toward the inside of the mounting jig 500, the ferromagnetic protrusion 545 that moves along the handle 520 in the direction away from the front surface of the display device 100 may be disposed at the end of the first guide part 563 and may pull the first guide part 563 and rotate the guard rail 560. For example, the first plate 561 of the guard rail 560 may move in the direction away from the front surface of the display device 100 while being in a line with the handle 520, the jig ferromagnetic body 540, and the jig magnet 530. In addition, the third plate 566 of the guard rail 560 may move toward the front surface of the display device 100 and toward the inside of the mounting jig 500, while being in a line with the first plate 561 and the jig magnet 530. Accordingly, when the mounting jig 500 is switched from the first state to the second state, the first plate 561 of the guard rail 560, the plurality of jig magnets 530 and the plurality of jig ferromagnetic bodies 540 may rotate in the direction away from the front surface of the display device 100 based on the hinge structure 550, and the handle 520 and the third plate 566 of the guard rail 560 may rotate together toward the front surface of the display device 100 and the inside of the mounting jig 500 based on the hinge structure 550.

And, when the mounting jig 500 is in the second state, the guard rail 560 rotates, so that the first plate 561 of the guard rail 560 may be disposed so as not to correspond to the front surface of the display device 100 and the hinge structure 550 may be in contact with the display device 100. The hinge structure 550 may contact the display device 100 and support the mounting jig 500. When a position of the mounting jig 500 is aligned in the second state, since the hinge structure 550 supports the mounting jig 500, the position of the mounting jig 500 may be stably aligned.

Also, since the second state is a state in which the jig magnets 530 and the jig ferromagnetic bodies 540 rotate toward the outside of the mounting jig 500 in a direction away from the front surface of the display device 100, the second state may be a state in which the hinge structure 550 is in contact with the front surface of the display device 100, but the plurality of jig magnets 530 and the plurality of jig ferromagnetic bodies 540 may be disposed to be spaced apart from the display device 100 and a safety distance between the jig magnets 530 and the panel magnets 130 may be secured.

Figure 6D:
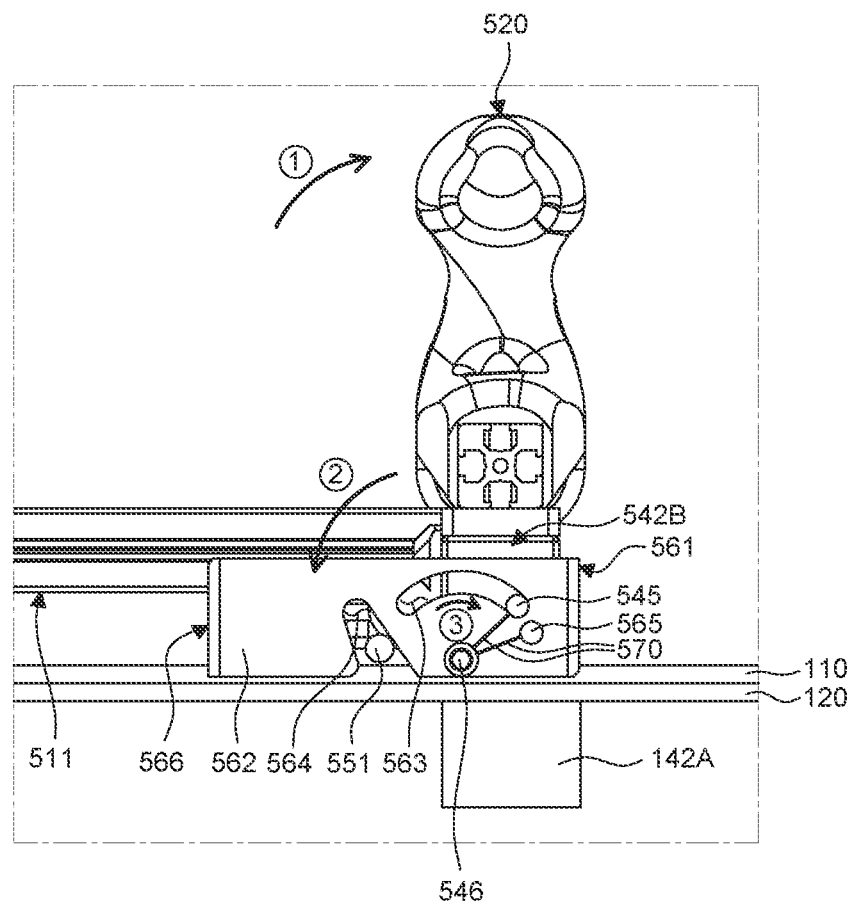
Figure 6E:
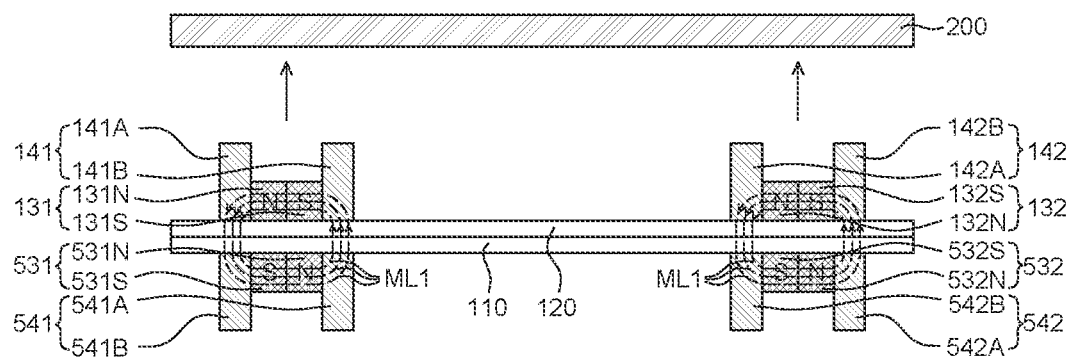

Next, referring to FIGS. 6D and 6E together, the jig magnets 530 and the panel magnets 130 may be disposed to correspond to each other by changing the mounting jig 500 from the second state to the third state. That is, the mounting jig 500 may be fixed to the front surface of the display device 100 by disposing the mounting jig 500 in the third state.

In the mounting jig 500 in the second state, the mounting jig 500 may be changed into the third state by rotating the handle 520 toward the outside of the mounting jig 500, in direction of arrow ①. Specifically, the handle 520 on the left side that is fixed to the third supporting member 513 may be rotated in a direction away from the fourth supporting member 514, and the handle 520 on the right side that is fixed to the fourth supporting member 514 may be rotated in a direction away from the third supporting member 513.

And, according to the rotation of the handle 520 on the left side, the third supporting member 513 that is fixed to the handle 520 on the left side, and the first jig magnet 531 and the third jig magnet 533 that are fixed to the third supporting member 513 may rotate toward the inside of the mounting jig 500 and the front surface of the display device 100 based on the hinge structure 550. According to the rotation of the handle 520 on the right side, the fourth supporting member 514 that is fixed to the handle 520 on the right side, and the second jig magnet 532 and the fourth jig magnet 534 that are fixed to the fourth supporting member 514 may rotate toward the inside of the mounting jig 500 and the front surface of the display device 100, based on the hinge structure 550. That is, the handle 520, and the plurality of jig magnets 530, and the plurality of jig ferromagnetic bodies 540 may be disposed in a state that is identical to the first state by rotating the handle 520 of the mounting jig 500 toward the outside of the mounting jig 500. Accordingly, the plurality of jig magnets 530 and the plurality of jig ferromagnetic bodies 540 may be disposed in contact with the front surface of the display device 100 or may be disposed closest to the front surface of the display device 100, and may be disposed to correspond to the panel magnets 130 and the panel ferromagnetic bodies 140 on the rear surface of the display device 100.

Specifically, the mounting jig 500 may be attached to the display device 100 so that the plurality of panel magnets 130 and the plurality of jig magnets 530 correspond to each other and the plurality of panel ferromagnetic bodies 140 correspond to the plurality of jig ferromagnetic bodies 540. For example, as illustrated in FIG. 6E, the first jig magnet 531 and the second jig magnet 532 of the mounting jig 500 are disposed so that polarities thereof are disposed to be opposite to and overlapped with polarities of the first panel magnet 131 and the second panel magnet 132 of the display device 100 corresponding thereto. That is, the mounting jig 500 may be disposed so that an N-pole 531N of the first jig magnet 531 overlaps the S-pole 131S of the first panel magnet 131, an S-pole 531S of the first jig magnet 531 overlaps the N-pole 131N of the first panel magnet 131, an N-pole 532N of the second jig magnet 532 overlaps the S-pole 132S of the second panel magnet 132, and an S-pole 532S of the second jig magnet 532 overlaps the N-pole 132N of the second panel magnet 132. In addition, the mounting jig 500 may be disposed so that a first portion 541A of the first jig ferromagnetic body 541 overlaps a second portion 141B of the first panel ferromagnetic body 141, a second portion 541B of the first jig ferromagnetic body 541 overlaps a first portion 141A of the first panel ferromagnetic body 141, a first portion 542A of the second jig ferromagnetic body 542 overlaps a second portion 142B of the second panel ferromagnetic body 142, and a second portion 542B of the second jig ferromagnetic body 542 overlaps a first portion 142A of the second panel ferromagnetic body 142. As the mounting jig 500 is disposed as described above, a first magnetic force line ML1 may be induced to the first jig magnet 531, the first jig ferromagnetic body 541, the first panel magnet 131, and the first panel ferromagnetic body 141, and a first magnetic force line ML1 may also be induced to the second jig magnet 532, the second jig ferromagnetic body 542, the second panel magnet 132, and the second panel ferromagnetic body 142.

Meanwhile, when the mounting jig 500 in the second state is changed to the third state, the first plate 561 and the third plate 566 of the guard rail 560 that are in a line with the plurality of jig magnets 530 and the plurality of jig ferromagnetic bodies 540 may rotate in directions different from those of the plurality of jig magnets 530 and the plurality of jig ferromagnetic bodies 540. For example, the third plate 566 of the guard rail 560 may rotate in direction of arrow ②, which is opposite to the direction of arrow ① in which the handle 520 rotates.

Specifically, referring to FIGS. 6C and 6D, in the second state, the guard rail 560 may be disposed such that the first plate 561 is in a line with the jig magnets 530 and the jig ferromagnetic bodies 540 and an edge of the first plate 561 comes into contact with the front surface of the display device 100. That is, in the second state, the plurality of jig magnets 530, the plurality of jig ferromagnetic bodies 540, and the first plate 561 may be disposed to be inclined with respect to the front surface of the display device 100. In addition, when the mounting jig 500 is changed from the second state to the third state, the plurality of jig ferromagnetic bodies 540 and the ferromagnetic protrusion 545 may rotate toward the front surface of the display device 100. In this case, the ferromagnetic protrusion 545 may rotate toward an end adjacent to the fixing part 565 among the both ends of the first guide part 563 along direction of arrow ③, and the elastic force of the elastic member 570 that spaces the ferromagnetic protrusion 545 and the fixing part 565 from each other may apply force that rotates the guard rail 560 and the ferromagnetic protrusion 545 in the same direction, that is, rotates the guard rail 560 in the same direction as the jig ferromagnetic body 540. That is, the guard rail 560 is rotated in the same direction as the plurality of jig ferromagnetic bodies 540 by the elastic member 570, but rotation of the guard rail 560 of which the first plate 561 is in contact with the display device 100 may be restricted.

In a state in which the guard rail 560 cannot be rotated in the same direction as the plurality of jig ferromagnetic bodies 540 and is fixed by the display device 100, the ferromagnetic protrusion 545 may slide along the first guide part 563 toward direction of arrow ③. The ferromagnetic protrusion 545 may slide toward an end adjacent to the first plate 561 from an end adjacent to the third plate 566 among the both ends of the first guide part 563. In addition, according to the sliding of the ferromagnetic protrusion 545, the third plate 566 of the guard rail 560 may rotate toward the front surface of the display device 100 based on the edge of the first plate 561 in contact with the front surface of the display device 100. That is, the third plate 566 of the guard rail 560 may rotate toward the front surface of the display device 100, in direction of arrow ② based on the edge of the first plate 561 in contact with the front surface of the display device 100 by the ferromagnetic protrusion 545 moving along the first guide part 563.

At this time, the elastic member 570 applies an elastic force for spacing the ferromagnetic protrusion 545 that slides toward the end of the first guide part 563 adjacent to the fixing part 565 and the fixing part 565, but since the plurality of jig magnets 530 maintain a state in which they are fixed to the front surface of the display device 100 by magnetic force with the plurality of panel magnets 130, the ferromagnetic protrusion 545 may maintain a state in which it is disposed at the end of the first guide part 563 adjacent to the fixing part 565.

Therefore, when the mounting jig 500 is in the third state, the plurality of jig magnets 530 and the plurality of jig ferromagnetic bodies 540 may be disposed closest to the display device 100 or in contact with the front surface of the display device 100. When the mounting jig 500 is in the third state, the plurality of jig magnets 530, the plurality of jig ferromagnetic bodies 540, the plurality of panel magnets 130, and the plurality of panel ferromagnetic bodies 140 may form the first magnetic force line ML1, and the mounting jig 500 may be attached to the front surface of the display device 100. When the mounting jig 500 is in the third state, in the guard rail 560, an entirety of the edge of the first plate 561, an edge of the second plate 562, and an edge of the third plate 566 may contact the display device 100. When the mounting jig 500 is in the third state, the guard rail 560 may not be disposed between the plurality of jig magnets 530 and the plurality of jig ferromagnetic bodies 540 and the display device 100 so that the plurality of jig magnets 530 and the plurality of jig ferromagnetic bodies 540 may be adjacent to or in contact with the front surface of the display device 100.

After fixing the mounting jig 500 to the front surface of the display device 100 by changing the mounting jig 500 to the third state, the operator may transport the display device 100. Specifically, the operator may transport the display device 100 attached to the mounting jig 500 in the Z-axis direction, that is, in a direction of arrows in FIG. 6E, that is, toward the wall part 200 by the first magnetic force lines ML1, while grasping the handles 520 of the mounting jig 500.

Figure 6F:
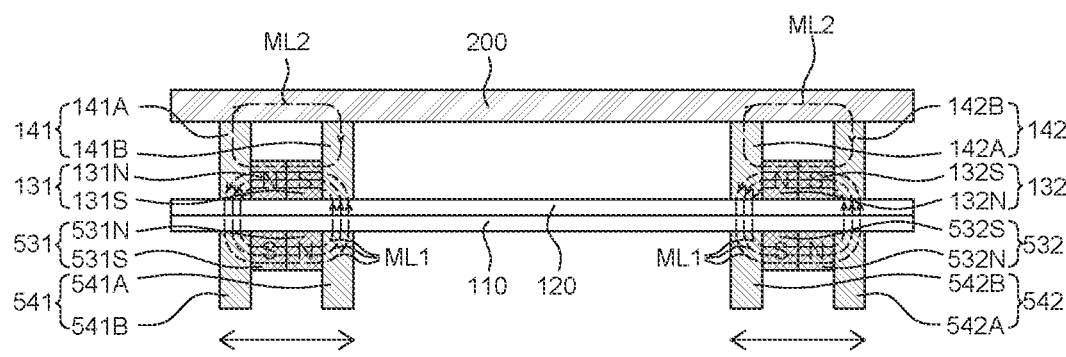

Referring to FIG. 6F, the display device 100 is brought into contact with the wall part 200. The first panel ferromagnetic body 141 and the second panel ferromagnetic body 142 on the rear surface of the display device 100 may contact the wall part 200. In this case, the wall part 200 may have a plate shape formed of a metallic material, for example, may be a plate formed of a ferromagnetic material, steel, but is not limited thereto. Accordingly, the wall part 200 may a simple plate shape formed of a metallic material to which the first panel ferromagnetic body 141 and the second panel ferromagnetic body 142 can be attached by magnetism, without the need to include a complex shape or a complex mechanism. Accordingly, there is no need to accurately align the first panel ferromagnetic body 141 and the second panel ferromagnetic body 142 at a specific position of the wall part 200 in a process of bringing the display device 100 into contact with the wall part 200, so that relatively less precise alignment is not matter.

A second magnetic force line ML2 may be induced to the wall part 200, the first panel ferromagnetic body 141, and the first panel magnet 131 while the display device 100 is in contact with the wall part 200, and a second magnetic force line ML2 may be induced to the wall part 200, the second panel ferromagnetic body 142, and the second panel magnet 132. However, the first magnetic force line ML1 is a magnetic force line induced by two magnets and two ferromagnetic bodies, whereas the second magnetic force line ML2 is a magnetic force line induced by one magnet and one ferromagnetic body, so that a magnitude of the first magnetic force line ML1 may be greater than a magnitude of the second magnetic force line ML2. Accordingly, since a force for the mounting jig 500 to fix the display device 100 by the first magnetic force line ML1 is greater than a force to fix the display device 100 and the wall part 200, the display device 100 may not be fixed to the wall part 200, and an operator may move the display device 100 together in a manner as to move the mounting jig 500. Specifically, the operator may move the display device 100 in the X-axis direction and may also move the display device 100 in the Y-axis direction as indicated by arrows illustrated in FIG. 6F by moving the mounting jig 500 in a state in which the display device 100 is in contact with the wall part 200. Accordingly, the operator may more precisely align the display device 100 while the display device 100 is in contact with the wall part 200 and finally align the display device 100.

As illustrated in FIG. 6F, when the second magnetic force lines ML2 exist, the operator may more easily align the display device 100. That is, when the second magnetic force lines ML2 exist between the display device 100 and the wall part 200, since the operator can move the display device 100 little by little by the second magnetic force lines ML2 and thus, may more easily align the display device 100.

However, if it is intended to improve a degree of sliding in an alignment process of the display device 100 by completely removing the second magnetic force lines ML2, the second magnetic force lines ML2 may be completely removed by adjusting degrees of intensity of the jig magnets 530 of the mounting jig 500 and the panel magnets 130 of the display device 100. That is, by making magnetic force of the jig magnets 530 of the mounting jig 500 much greater than magnetic force of the panel magnets 130 of the display device 100, the second magnetic force lines ML2 may be removed and only the first magnetic force lines ML1 may exist.

Figure 6G:
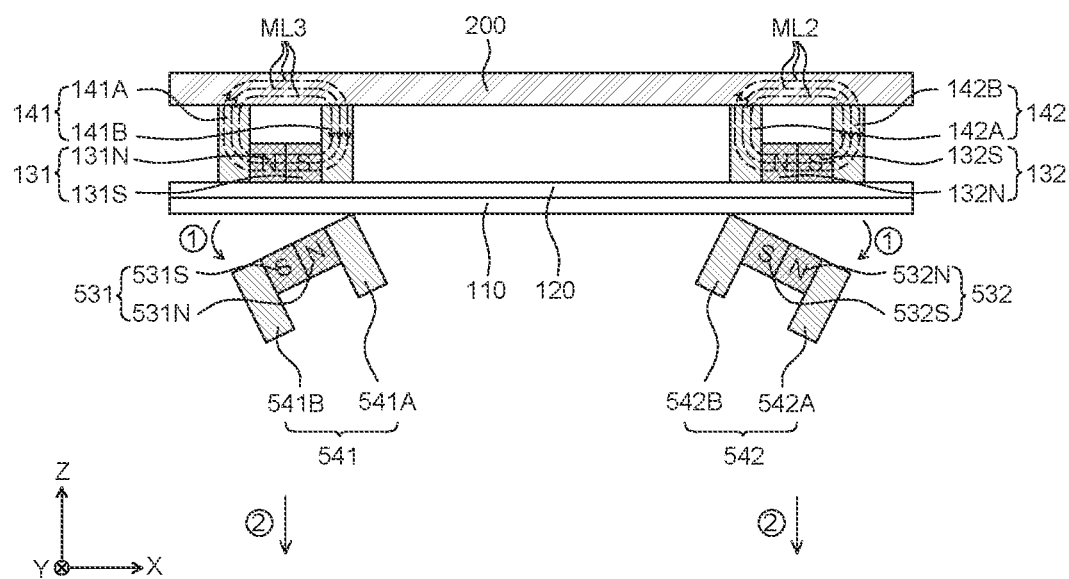

Referring to FIG. 6G, the mounting jig 500 may be detached from the display device 100. That is, after aligning the display device 100 at a desired position, the mounting jig 500 may be detached from the display device 100 using the handle 520 of the mounting jig 500.

Specifically, the operator may rotate the handle 520 of the mounting jig 500 using the hinge structure 550. In this case, the first jig magnet 531, the first jig ferromagnetic body 541, the second jig magnet 532, and the second jig ferromagnetic body 542 of the mounting jig 500 are rotated in direction of arrow ① as illustrated in FIG. 6G, and can be detached from the display device 100. In FIG. 6G, it is illustrated that arrow ① is positioned on XZ plane for convenience of illustration, but in fact, arrow ① is positioned on YZ plane.

Accordingly, as the first jig magnet 531, the first jig ferromagnetic body 541, the second jig magnet 532, and the second jig ferromagnetic body 542 of the mounting jig 500 are detached from the display device 100, the first magnetic force line ML1 is removed, and a third magnetic force line ML3 having an intensity greater than that of the second magnetic force line ML2 may be induced to the wall part 200, the first panel ferromagnetic body 141, the first panel magnet 131, and the wall part 200, the second panel ferromagnetic body 142, and the second panel magnet 132. Accordingly, after the mounting jig 500 is completely separated from the display device 100 in direction of arrow ②, the display device 100 may be attached to and fixed to the wall part 200 by the third magnetic force line ML3.

Meanwhile, when the plurality of jig magnets 530 and the plurality of jig ferromagnetic bodies 540 are separated from the display device 100 by rotating the handle 520 of the mounting jig 500, due to attractive forces between the plurality of jig magnets 530, the plurality of jig ferromagnetic bodies 540, the plurality of panel magnets 130, and the plurality of panel ferromagnetic bodies 140, the display device 100 attached to the wall part 200 may be temporally lifted or the display device 100 may be detached from the wall part 200, so that a position of the display device 100 may be misaligned or the display device 100 may be damaged. At this time, when the mounting jig 500 is detached from the display device 100, the display device 100 and the mounting jig 500 may be easily separated while the display device 100 is prevented from being detached from the wall part 200 by using the guard rail 560.

Figure 6H:
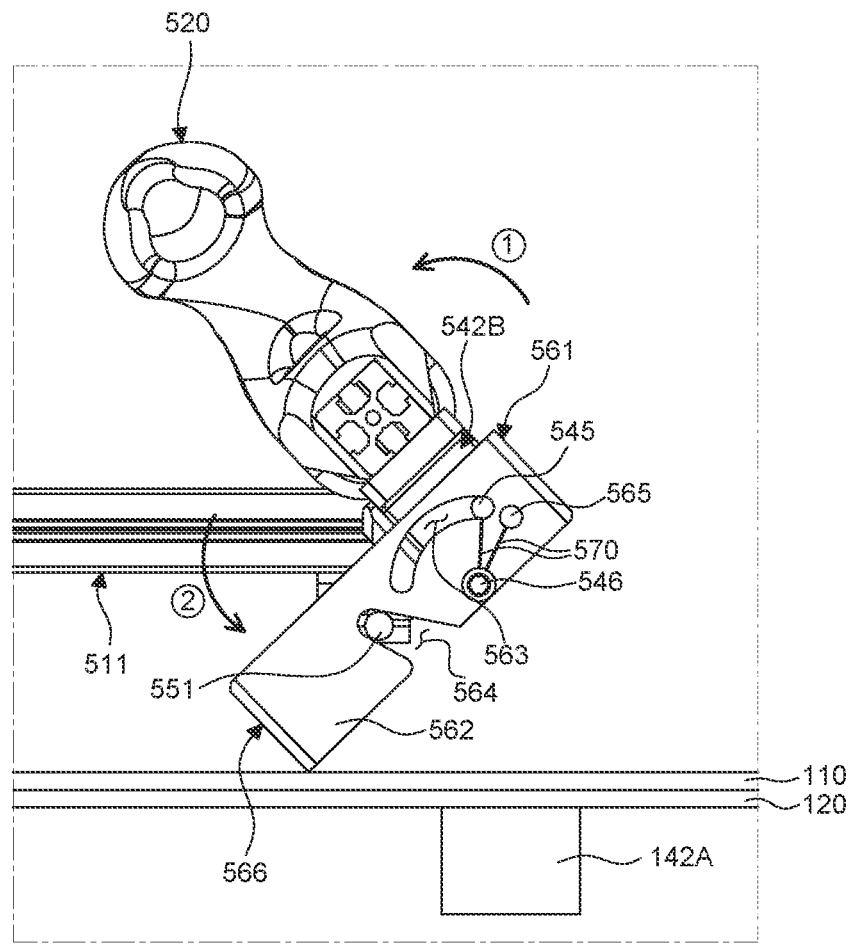

Referring to FIGS. 6D and 6H together, the mounting jig 500 in the third state is changed to a fourth state, and the mounting jig 500 can be easily detached from the display device 100 without the display device 100 being lifted or detached from the wall part 200.

In the mounting jig 500 in the third state, the handle 520 may be rotated toward the inside of the mounting jig 500, in direction of arrow ①, so that the mounting jig 500 may be changed to the fourth state. Specifically, the handle 520 on the left side that is fixed to the third supporting member 513 can be rotated toward the fourth supporting member 514, and the handle 520 on the right side that is fixed to the fourth supporting member 514 can be rotated toward the third supporting member 513.

And, the third supporting member 513 that is fixed to the handle 520 on the left side, and the first jig magnet 531 and the third jig magnet 533 that are fixed to the third supporting member 513 may rotate together with the handle 520 on the left side based on the hinge structure 550, and the fourth supporting member 514 that is fixed to the handle 520 on the right side, and the second jig magnet 532 and the fourth jig magnet 534 that are fixed to the fourth supporting member 514 may also rotate with the handle 520 on the right side based on the hinge structure 550. For example, the first jig magnet 531 and the third jig magnet 533 may be in a line with the handle 520 on the left side and rotate in a direction away from the display device 100 to thereby be spaced apart from the display device 100, and the second jig magnet 532 and the fourth jig magnet 534 may be in a line with the handle 520 on the right side and rotate in a direction away from the display device 100 to thereby be spaced apart from the display device 100. Accordingly, the plurality of jig magnets 530 and the plurality of jig ferromagnetic bodies 540 that are closest to or in contact with the front surface of the display device 100 can be spaced apart from the display device 100 by rotating the handle 520 toward the inside of the mounting jig 500, and the mounting jig 500 can be detached from the display device 100.

At this time, in a situation in which attractive forces exist between the plurality of panel magnets 130 and the plurality of panel ferromagnetic bodies 140 and the plurality of jig magnets 530 and the plurality of jig ferromagnetic bodies 540, when the plurality of jig magnets 530 and the plurality of jig ferromagnetic bodies 540 are rotated, the display device 100 may be temporarily lifted from the wall part 200 or detached from the wall part 200 along the plurality of jig magnets 530 and the plurality of jig ferromagnetic bodies 540, and in this process, a position of the display device 100 may be misaligned or the display device 100 may be damaged.

Accordingly, while the plurality of jig magnets 530 and the plurality of jig ferromagnetic bodies 540 move in a direction away from the display device 100, the guard rail 560 may push the display device 100 toward the wall part 200 to reduce lifting and detachment of the display device 100 from the wall part 200.

In the mounting jig 500 in the third state in which the edge of the first plate 561, the edge of the second plate 562, and the edge of the third plate 566 are in contact with the display device 100, when the handle 520 is rotated toward the inside of the mounting jig 500, the second plate 562 of the guard rail 560 may move in a direction away from the display device 100 together with the supporting shaft 546. In addition, the first plate 561 of the guard rail 560 may rotate in a direction away from the display device 100 by the second plate 562 rotating together with the supporting shaft 546, and the third plate 566 of the guard rail 560 may move toward the outside of the mounting jig 500 while being in contact with the front surface of the display device 100. For example, the first plate 561 may move in direction of arrow ①, and the third plate 566 may move in direction of arrow ②.

The plurality of jig magnets 530 and the plurality of jig ferromagnetic bodies 540 may be spaced apart from the display device 100 in a state in which the edge of the third plate 566 is in contact with the front surface of the display device 100. The first plate 561 may rotate based on the edge of the third plate 566 in contact with the front surface of the display device 100, and the edge of the third plate 566 may push the display device 100 toward the wall part 200 during rotation of the plurality of jig magnets 530, the plurality of jig ferromagnetic bodies 540, and the first plate 561, so that it is possible to reduce lifting or detachment of the display device 100 from the wall part 200 along the plurality of jig magnets 530 and the plurality of jig ferromagnetic bodies 540.

At this time, the elastic force of the elastic member 570 may rotate the fixing part 565 of the guard rail 560 and the first plate 561 adjacent to the fixing part 565 in a direction away from the jig ferromagnetic bodies 540 and the jig magnets 530. That is, the elastic member 570 may move the first plate 561 of the guard rail 560 toward the front surface of the display device 100, and the jig ferromagnetic bodies 540 may move the first plate 561 of the guard rail 560 in a direction away from the front surface of the display device 100. However, even if an elastic force that rotates the first plate 561 of the guard rail 560 toward the display device 100 is applied, the first plate 561 of the guard rail 560 may move in a direction away from the display device 100 together with the plurality of jig magnets 530 and the plurality of jig ferromagnetic bodies 540 as described above.

Specifically, when the guard rail 560 rotates together with the handle 520, the plurality of jig magnets 530, and the plurality of jig ferromagnetic bodies 540, it may be a state in which the hinge protrusion 551 is inserted in the second guide part 564 of the guard rail 560. And, the hinge protrusion 551 that is inserted in the second guide part 564 of the guard rail 560 may restrict rotation of the first plate 561 of the guard rail 560 toward the display device 100 due to an elastic force. Accordingly, the hinge protrusion 551 that is inserted into the second guide part 564 may limit a rotation direction of the guard rail 560 and may rotate the first plate 561 of the guard rail 560 in a direction away from the display device 100, regardless of the elastic force applied to the fixing part 565 of the guard rail 560. Also, the elastic member 570 may apply an elastic force to slide the ferromagnetic protrusion 545 toward the end of the first guide part 563 adjacent to the third plate 566. However, since the hinge protrusion 551 is inserted into the second guide part 564 and the first plate 561 of the guard rail 560 rotates while maintaining the same distance as the jig ferromagnetic body 540, the ferromagnetic protrusion 545 may maintain the same distance as the first plate 561, and the ferromagnetic protrusion 545 may maintain a state in which it is disposed at the end of the first guide part 563 adjacent to the fixing part 565.

Meanwhile, when changing from the third state to the fourth state, when the hinge protrusion 551 is not inserted into the second guide part 564 of the guard rail 560, the first plate 561 in the guard rail 560 may rotate toward the front surface of the display device 100. In this case, the hinge protrusion 551 may be inserted into the second guide part 564 by rotating the guard rail 560 and the handle 520 together and after the hinge protrusion 551 is inserted into the second guide part 564, the guard rail 560 may rotate together with the rotation of the handle 520 even if no force is applied to the guard rail 560.

Accordingly, in a case in which the mounting jig 500 is in the fourth state, when the plurality of jig magnets 530 rotate in a direction away from the display device 100, since the third plate 566 of the guard rail 560 maintains a state in contact with the front surface of the display device 100, lifting or detachment of the display device 100 from the wall part 200 along the plurality of jig magnets 530 can be reduced, and the plurality of jig magnets 530 can be easily detached from the display device 100.

Figure 6I:
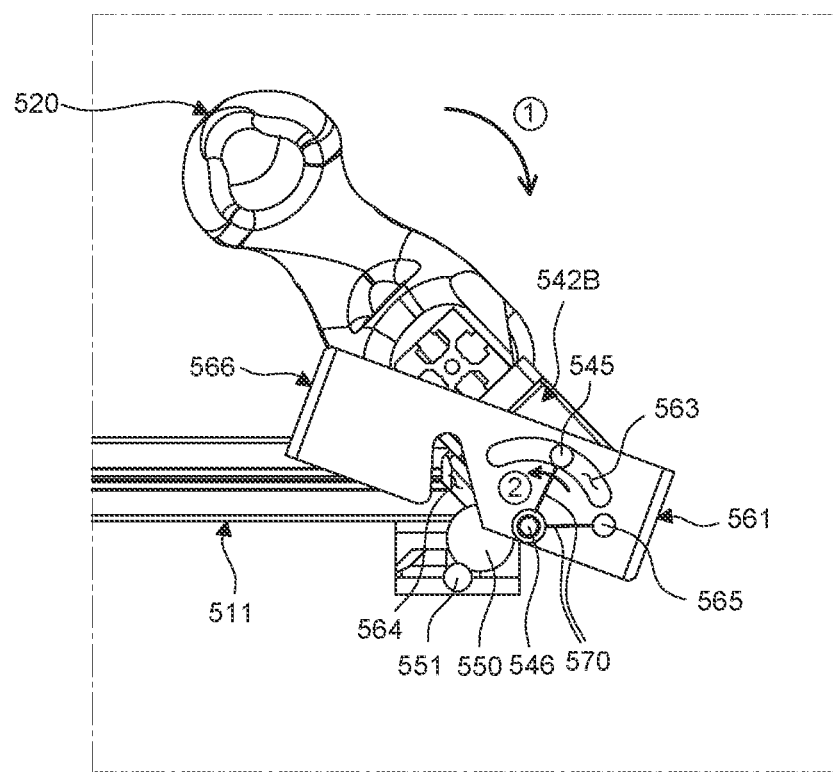
Figure 6J:
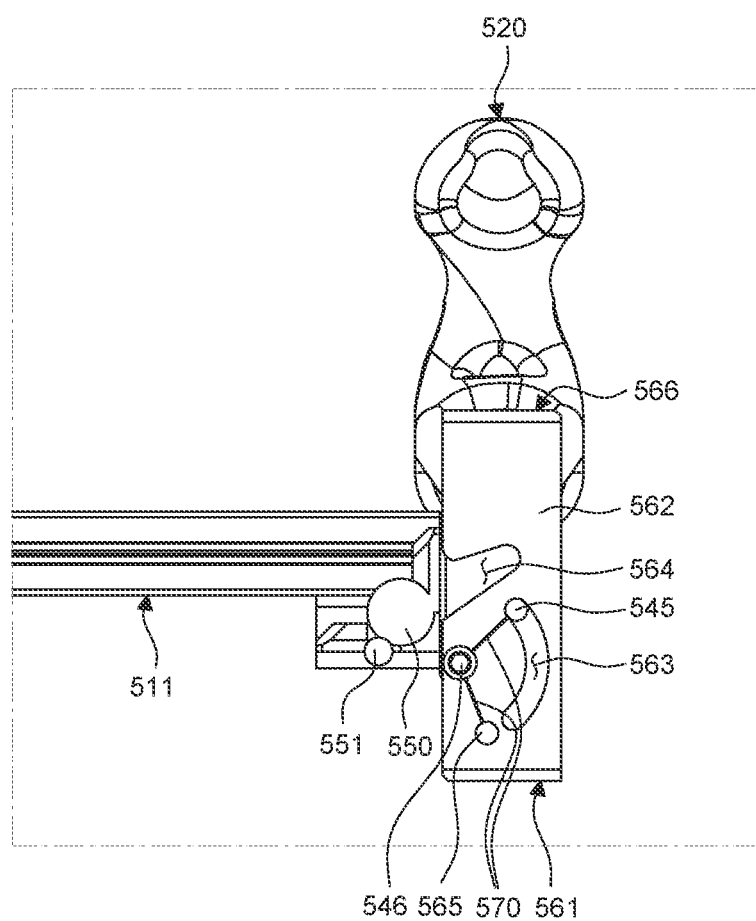

Next, referring to FIGS. 6I and 6J, when a manufacturing of the tiling display device TD is completed, the mounting jig 500 may be changed from the fourth state to the first state. By changing the mounting jig 500 to the first state, it is possible to secure a safety distance between the jig magnets 530 of the mounting jig 500 and the panel magnets 130 of the display device 100, and the mounting jig 500 may be prevented from being unintentionally attached to the display device 100.

In the mounting jig 500 in the fourth state, the mounting jig 500 may be changed to the first state by rotating the handle 520 toward the outside of the mounting jig 500 in direction of arrow ①. Specifically, the handle 520 on the left side that is fixed to the third supporting member 513 may be rotated in a direction away from the fourth supporting member 514, and the handle 520 on the right side that is fixed to the fourth supporting member 514 may be rotated in a direction away from the third supporting member 513.

And, according to the rotation of the handle 520 on the left side, the third supporting member 513 that is fixed to the handle 520 on the left side, and the first jig magnet 531 and the third jig magnet 533 that are fixed to the third supporting member 513 may rotate toward the inside of the mounting jig 500 based on the hinge structure 550. According to the rotation of the handle 520 on the right side, the fourth supporting member 514 that is fixed to the handle 520 on the right side, and the second jig magnet 532 and the fourth jig magnet 534 that are fixed to the fourth supporting member 514 may rotate toward the inside of the mounting jig 500 based on the hinge structure 550.

In this case, in the mounting jig 500 in the fourth state, the ferromagnetic protrusion 545 is disposed at an end adjacent to the first plate 561 among the both ends of the first guide part 563. In this case, when the jig ferromagnetic body 540 is rotated toward the inside of the mounting jig 500, the ferromagnetic protrusion 545 disposed at the end adjacent to the first plate 561 may rotate and the guard rail 560 in which the first guide part 563 is formed may be pulled, and the first plate 561 of the guard rail 560 may move along the ferromagnetic protrusion 545 and the supporting shaft 546. For example, the first plate 561 of the guard rail 560 may rotate in the same direction as the ferromagnetic protrusion 545, and the third plate 566 of the guard rail 560 may move toward the first supporting member 511 and the second supporting member 512.

In the fourth state, the hinge protrusion 551 is inserted into the second guide part 564 of the guard rail 560 and restricts the first plate 561 of the guard rail 560 from rotating in a direction away from the jig magnets 530 and the jig ferromagnetic bodies 540. When changing from the fourth state to the first state, the hinge protrusion 551 may slide to the outside of the second guide part 564 according to the rotation of the handle 520 and the jig ferromagnetic bodies 540. Therefore, when changing from the fourth state to the first state, as the hinge protrusion 551 slides to the outside of the second guide part 564, the hinge protrusion 551 may no longer limit the rotation of the guard rail 560.

And, referring to FIG. 6I, at a moment in which the hinge protrusion 551 is disposed outside the second guide part 564, the guard rail 560 may rotate so that the ferromagnetic protrusion 545 and the fixing part 565 can be spaced apart as far as possible by the elastic force of the elastic member 570. As described above, the elastic force of the elastic member 570 that spaces the jig ferromagnetic bodies 540 and the jig magnets 530 and the first plate 561 of the guard rail 560 may act on the guard rail 560. Accordingly, when the hinge protrusion 551 is disposed outside the second guide part 564 and no longer limits the rotation of the guard rail 560, the fixing part 565 of the guard rail 560 may rotate in a direction away from the ferromagnetic protrusion 545 and the ferromagnetic protrusion 545 may also rotate in a direction away from the fixing part 565 and in direction of arrow ②. Accordingly, the third plate 566 may be disposed on a side surface of the handle 520, and the first plate 561 may be disposed to face the handle 520 with the jig magnets 530 and the jig ferromagnetic bodies 540 interposed therebetween.

Meanwhile, in a state in which the tiling display device TD is manufactured using processes illustrated in FIGS. 6A to 6J, to replace or repair a specific display device 100 or to disassemble the tiling display device TD, there may be a situation in which the display device 100 needs to be separated from the wall part 200. Even in this case, the display device 100 can be easily detached from the wall part 200 by using the mounting jig 500. Hereinafter, FIGS. 7A to 7E are referred together for a more detailed description of a method of separating the display device 100 from the wall part 200 in a manufacturing method of the tiling display device TD according to an embodiment of the present disclosure.

Figure 7A:
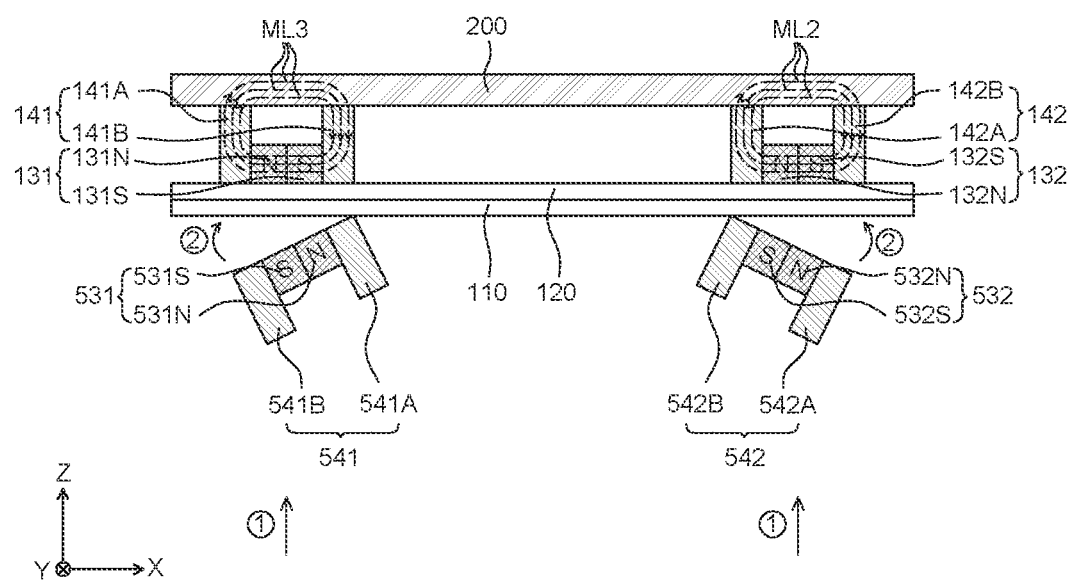
FIGS. 7A to 7F are cross-sectional views for explaining a manufacturing method of a tiling display device according to an embodiment of the present disclosure.
Figure 7B:
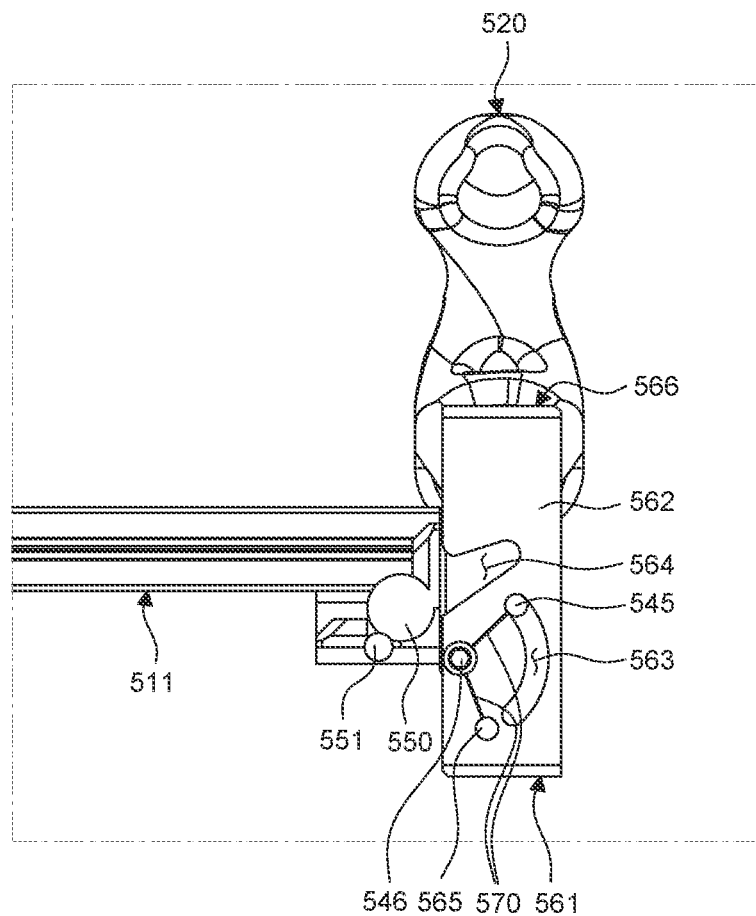
Figure 7C:
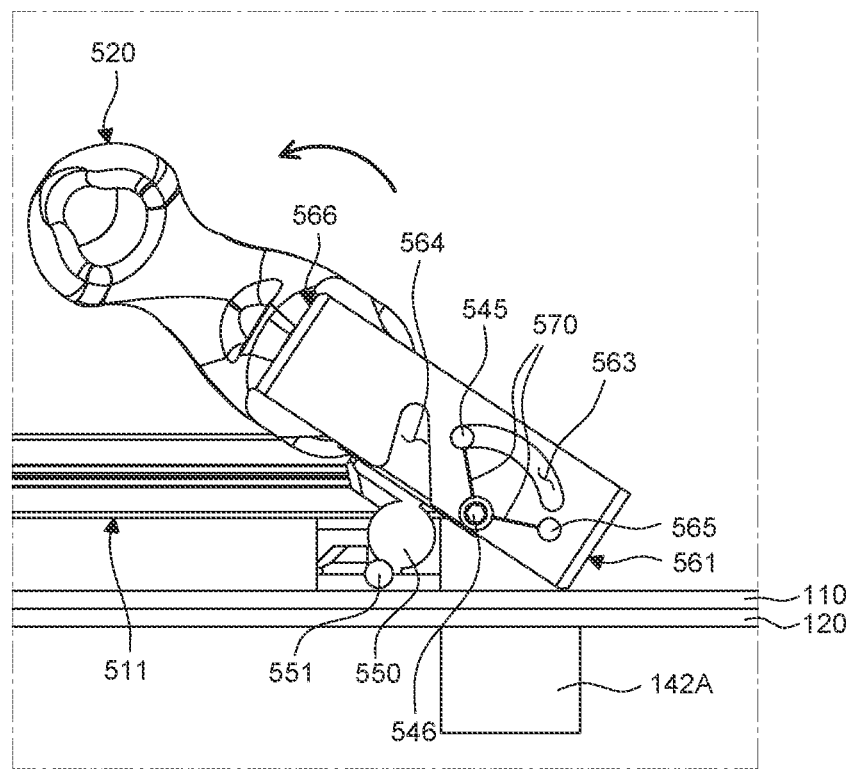
Figure 7D:
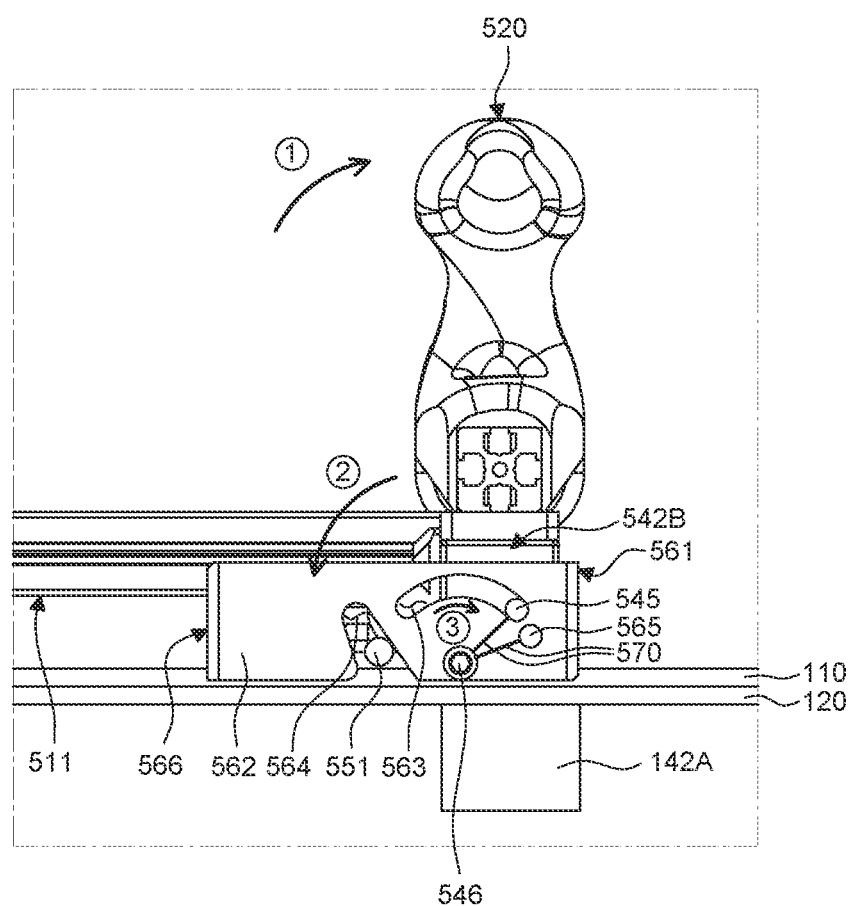
Figure 7E:
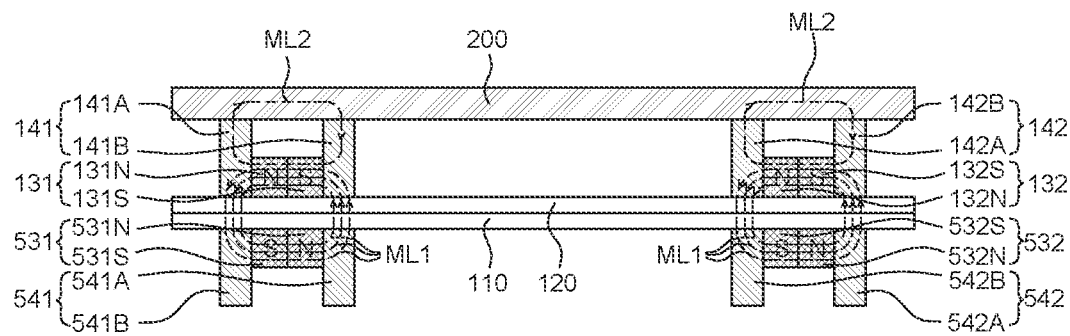
Figure 7F:
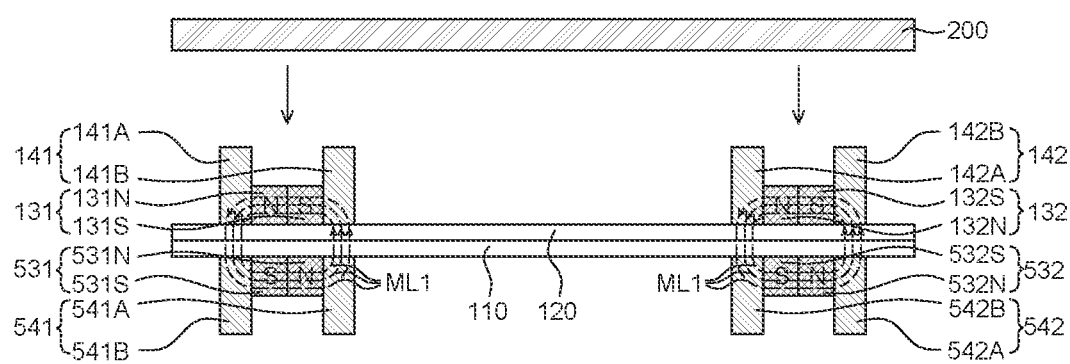

FIGS. 7A to 7F are cross-sectional views for explaining a manufacturing method of a tiling display device according to an embodiment of the present disclosure. Specifically, FIGS. 7A to 7F are cross-sectional views for explaining a method of separating the tiling display device TD from the wall part 200. FIGS. 7A, 7E, and 7F are schematic cross-sectional views of the display device 100 and the mounting jig 500 during the separation process of the tiling display device TD. FIGS. 7B to 7D are cross-sectional views of the mounting jig 500 during the separation process of the tiling display device TD.

First, referring to FIG. 7A, until the plurality of jig magnets 530 and the plurality of jig ferromagnetic bodies 540 of the mounting jig 500 are brought into contact with the display device 100, the third magnetic force line ML3 may be induced to the wall part 200, the first panel ferromagnetic body 141, and the first panel magnet 131, and the wall part 200, the second panel ferromagnetic body 142, and the second panel magnet 132. Accordingly, the display device 100 may be in a state in which it is attached to the wall part 200. Meanwhile, in FIG. 7A, for convenience of illustration, arrow ② is illustrated as being positioned on the XZ plane, but in fact, arrow ② is positioned on the YZ plane.

In order to detach the display device 100 from the wall part 200, the operator may move the mounting jig 500 to be disposed in contact with the display device 100 in direction of arrow ①. In this case, the operator may align the mounting jig 500 at a desired position of the display device 100. That is, the mounting jig 500 may be aligned on the front surface of the display device 100 so that the plurality of panel magnets 130 and the plurality of jig magnets 530 correspond to each other and the plurality of panel ferromagnetic bodies 140 correspond to the plurality of jig ferromagnetic bodies 540.

In this case, the mounting jig 500 moving in direction of arrow ① may be a mounting jig 500 in the first state in order to prevent sudden attachment thereof while applying an impact to the display device 100. For example, referring to FIG. 7B, the first plate 561 of the guard rail 560 moves the mounting jig 500 in the first state that is disposed to face the front surface of the display device 100, in the direction of arrow ①, so that the mounting jig 500 and the display device 100 may be brought into contact with each other.

Next, after the mounting jig 500 in the first state is disposed on the front surface of the display device 100, the mounting jig 500 is changed to the second state and the third state, so that the mounting jig 500 and the display device 100 can be attached. For example, referring to FIGS. 7B and 7C, by changing the mounting jig 500 from the first state to the second state, the hinge structure 550 may be attached to the front surface of the display device 100 while a safety distance between the jig magnets 530 and the panel magnets 130 is secured. Even if the mounting jig 500 in the second state is in contact with the front surface of the display device 100, the mounting jig 500 in the second state may be easily aligned at a desired position without being disturbed by the attractive force between the jig magnets 530 and the panel magnets 130.

Then, after aligning the mounting jig 500 at a desired position, the plurality of jig magnets 530 and the plurality of jig ferromagnetic bodies 540 of the mounting jig 500 may be brought into contact with the display device 100 using the handle 520 of the mounting jig 500. That is, the operator may bring the plurality of jig magnets 530 and the plurality of jig ferromagnetic bodies 540 of the mounting jig 500 into contact with the display device 100 in a manner of rotating the handle 520 in direction of arrow ②. For example, referring to FIG. 7D, the handle 520 of the mounting jig 500 in the second state is rotated in direction of arrow ①, that is, toward the outside of the mounting jig 500, so that the plurality of jig magnets 530 and the plurality of jig ferromagnetic bodies 540 may be brought into contact with the display device 100. As the handle rotates in the direction of arrow ①, the ferromagnetic protrusion 545 may move to the end of the first guide part 563 adjacent to the fixing part 565 along direction of arrow ③, and the third plate 566 of the guard rail 560 may rotate toward the display device 100 in the direction of arrow ② based on the edge of the first plate 561 in contact with the display device 100. Accordingly, by rotating the handle 520 of the mounting jig 500, the plurality of jig magnets 530 and the plurality of jig ferromagnetic bodies 540 may be slowly brought into contact with the front surface of the display device 100, and the plurality of jig magnets 530 and the plurality of jig ferromagnetic bodies 540 and the plurality of panel magnets 130 and the plurality of panel ferromagnetic bodies 140 may be disposed to correspond to each other. Accordingly, the mounting jig 500 may be changed from the second state to the third state, so that the mounting jig 500 may be fixed to the front surface of the display device 100.

Referring to FIGS. 7D and 7E, the mounting jig 500 may be attached to the display device 100 so that the plurality of panel magnets 130 and the plurality of jig magnets 530 correspond to each other and the plurality of panel ferromagnetic bodies 140 correspond to the plurality of jig ferromagnetic bodies 540. For example, the first jig magnet 531 and the second jig magnet 532 of the mounting jig 500 are disposed so that polarities thereof are disposed to be opposite to and overlapped with polarities of the first panel magnet 131 and the second panel magnet 132 of the display device 100 corresponding thereto. That is, the mounting jig 500 may be disposed so that the N-pole 531N of the first jig magnet 531 overlaps the S-pole 131S of the first panel magnet 131, the S-pole 531S of the first jig magnet 531 overlaps the N-pole 131N of the first panel magnet 131, the N-pole 532N of the second jig magnet 532 overlaps the S-pole 132S of the second panel magnet 132, and the S-pole 532S of the second jig magnet 532 overlaps the N-pole 132N of the second panel magnet 132. In addition, the mounting jig 500 may be disposed so that the first portion 541A of the first jig ferromagnetic body 541 overlaps the second portion 141B of the first panel ferromagnetic body 141, the second portion 541B of the first jig ferromagnetic body 541 overlaps the first portion 141A of the first panel ferromagnetic body 141, the first portion 542A of the second jig ferromagnetic body 542 overlaps the second portion 142B of the second panel ferromagnetic body 142, and the second portion 542B of the second jig ferromagnetic body 542 overlaps the first portion 142A of the second panel ferromagnetic body 142. As the mounting jig 500 is disposed as described above, the first magnetic force line ML1 may be induced to the first jig magnet 531, the first jig ferromagnetic body 541, the first panel magnet 131, and the first panel ferromagnetic body 141, and the first magnetic force line ML1 may also be induced to the second jig magnet 532, the second jig ferromagnetic body 542, the second panel magnet 132, and the second panel ferromagnetic body 142.

At this time, as the first magnetic force line ML1 is induced, the second magnetic force line ML2 that is weaker than the first magnetic force line ML1 and the third magnetic force line ML3 may be induced to the wall part 200, the first panel ferromagnetic body 141, and the first panel magnet 131, and the wall part 200, the second panel ferromagnetic body 142, and the second panel magnet 132. Accordingly, a magnetic force between the display device 100 and the mounting jig 500 may be greater than a magnetic force between the display device 100 and the wall part 200.

Accordingly, when the operator pulls the mounting jig 500 in a direction of arrows illustrated in FIG. 7F, the display device 100 attached to the mounting jig 500 may be separated from the wall part 200. That is, since magnetic force of the mounting jig 500 that pulls the display device 100 is greater than magnetic force of the wall part 200 that pulls the display device 100, when the operator pulls the mounting jig 500, the display device 100 may be separated from the wall part 200 along the mounting jig 500, and the same operation is repeated for the plurality of display devices 100, so that the tiling display device TD may be disassembled.

A general manufacturing method of a tiling display device is implemented by disposing fixing mechanism on rear surfaces of a plurality of display devices and fastening the corresponding mechanism to the wall part. However, in a process of using the mechanism disposed on the rear surface of the display device, since an operator is located behind the wall part and performs a fastening process, there is a problem that a space for an operator to perform a work must be secured in a rear of the wall part. In addition, when repair of a specific display device among the plurality of display devices is required, the operator needs to move to the wall part and separate the mechanism and the wall part individually. In addition, in order to separate one display device, not only the corresponding display device but also the display devices adjacent to the corresponding display device may be inconveniently decoupled.

Accordingly, in the mounting jig 500 and the manufacturing method of a tiling display device using the same according to an embodiment of the present disclosure, the tiling display device TD can be easily manufactured on the front surfaces of the display devices 100 by using the plurality of panel magnets 130 and the plurality of panel ferromagnetic bodies 140 that are positioned on the rear surface of the display panel 110 and the metal plate 120 and the mounting jig 500 including the plurality of jig magnets 530 and the plurality of jig ferromagnetic bodies 540 corresponding to the plurality of panel magnets 130 and the plurality of panel ferromagnetic bodies 140. That is, since the display device 100 can be fixed to the wall part 200 in a state in which the display device 100 is grasped using the mounting jig 500 on the front surface of the display device 100, it is not necessary to separately secure a working space behind the wall part 200 in the display device 100, the tiling display device TD and the manufacturing method of the tiling display device TD according to an exemplary embodiment of the present disclosure. In addition, since the display device 100 can be easily detached from the wall part 200 by using the mounting jig 500 on the front surface of the display device 100, each of the plurality of display devices 100 can be easily installed, maintained, and repaired.

In the mounting jig 500 and the manufacturing method of a tiling display device using the mounting jig 500 according to an embodiment of the present disclosure, it is possible to reduce a sudden attachment of the mounting jig 500 to the display device 100 while the mounting jig 500 gives a strong impact to the display device 100, due to attractive forces between the jig magnets 530 and the panel magnets 130. First, before attaching the mounting jig 500 to the front surface of the display device 100, the mounting jig 500 may be disposed in the first state, so that the jig magnets 530 and the display device 100 may be spaced apart from each other. Specifically, a safety distance between the panel magnets 130 and the jig magnets 530 may be secured by disposing the first plate 561 of the guard rail 560 between the display device 100 and the jig magnets 530. Subsequently, the mounting jig 500 may be changed to the second state and the third state, so that the jig magnets 530 may be slowly attached to the front surface of the display device 100.

Specifically, the first plate 561 of the guard rail 560 and the jig magnets 530 are rotated in a direction away from the front surface of the display device 100, and the hinge structure 550 is brought into contact with the front surface of the display device 100. After aligning a position of the mounting jig 500 in a state in which the hinge structure 550 is in contact, the guard rail 560 and the jig magnets 530 may be rotated toward the display device 100. At this time, since the hinge structure 550 is already in contact with the display device 100 to thereby support the mounting jig 500, the mounting jig 500 is difficult to be attached to the display device 100 while giving a strong impact to the display device 100 due to attractive forces between the jig magnets 530 and the panel magnets 130. In addition, since an elastic member connected to the guard rail 560 and the jig ferromagnetic bodies 540 applies a force to rotate the jig magnets 530 in a direction away from the display device 100, the jig magnets 530 may be difficult to be attached to the display device 100 while giving a strong impact to the display device 100. Accordingly, in the mounting jig 500 and the manufacturing method of a tiling display device using the mounting jig 500 according to an embodiment of the present disclosure, when the mounting jig 500 is attached to the display device 100, it is possible to secure a safety distance between the jig magnets 530 and the panel magnets 130 by using the guard rail 560 and to reduce the attachment of the mounting jig 500 to the display device 100 while the mounting jig 500 gives a strong impact to the display device 100.

In the mounting jig 500 and the manufacturing method of a tiling display device using the mounting jig 500 according to an embodiment of the present disclosure, when the mounting jig 500 is detached from the display device 100 of which the attachment to the wall part 200 has been completed, it is possible to reduce a misalignment in a position of the display device 100 by temporary lifting or detachment of the display device 100 from the wall part 200 due to attractive forces between the jig magnets 530 and the panel magnets 130, or reduce damage to the display device 100 due to an impact applied during detachment. Specifically, when the mounting jig 500 and the display device 100 are separated in a state in which the jig magnets 530 and the panel magnets 130 form a magnetic force line, the display device 100 may be lifted or detached from the wall part 200 according to the jig magnets 530, so that a position of the display device 100 may be changed or an impact may be applied thereto. Accordingly, when the jig magnets 530 are separated from the front surface of the display device 100, the guard rail 560 can support the display device 100 to reduce the detachment of the display device 100 from the wall part 200. For example, when the jig magnets 530 are rotated in a direction away from the display device 100, the guard rail 560 also rotates together with the jig magnets 530, but the guard rail 560 may maintain a state in which the edge of the third plate 566 is in contact with the front surface of the display device 100. That is, the first plate 561 and the second plate 562 of the guard rail 560 rotate in a direction away from the display device 100 together with the jig magnets 530, but the third plate 566 of the guard rail 560 may slid in contact with the front surface of the display device 100. Accordingly, the third plate 566 of the guard rail 560 may push the display device 100 to the wall part 200 so that the display device 100 is not lifted or detached from the wall part 200 along the jig magnets 530. Therefore, in the mounting jig 500 and the manufacturing method of a tiling display device using the mounting jig 500 according to an embodiment of the present disclosure, when the jig magnets 530 are detached from the front surface of the display device 100, since the guard rail 560 pushes the display device 100 toward the wall part 200, it is possible to reduce a misalignment in a position of the display device 100 by lifting or detachment of the display device 100 from the wall part 200 due to the jig magnets 530, or reduce an impact being applied.

In addition, in the mounting jig 500 and the manufacturing method of a tiling display device using the mounting jig 500 according to an embodiment of the present disclosure, it is not necessary to align relatively precisely the display device 100 in a process in which the display device 100 is brought into contact with the wall part 200 using the mounting jig 500. When separate equipment is used to tile the display device 100, the equipment disposed on the display device 100 and the wall part 200 or the equipment disposed on the wall part 200 should be precisely aligned so that the display device 100 can be attached to the wall part 200. However, in the display device 100, the tiling display device TD and the manufacturing method of the tiling display device TD according to an embodiment of the present disclosure, the wall part 200 is configured in a shape of a simple plate formed of a metallic material, and as long as the plurality of panel magnets 130 and the plurality of panel ferromagnetic bodies 140 of the display device 100 contact the wall part 200, the display device 100 and the wall part 200 are primarily attached to each other. Accordingly, even if the wall part 200 having a simple shape and structure is used, more precise alignment is not required in a process of contacting the display device 100 and the wall part 200 first, so that an operator can more easily manufacture the tiling display device TD.

Meanwhile, a magnetic field has a form of a closed curve connecting the N and S poles of the magnet, and when a separate ferromagnetic body is brought into contact with each of the N and S poles of the magnet, a magnetic force line can be expanded through the ferromagnetic body. The expansion of the magnetic force line can be explained in the same meaning as that the ferromagnetic body in contact with each of the N and S poles of the magnet is temporarily magnetized.

According to this principle, in the mounting jig 500 and the manufacturing method of a tiling display device using the mounting jig 500 according to an embodiment of the present disclosure, the display device 100 can be attached to the wall part 200 using the plurality of panel magnets 130 and the plurality of panel ferromagnetic bodies 140 that are disposed on the rear surface of the display panel 110. That is, since the magnetic force line of the plurality of panel magnets 130 can be extended using the plurality of panel ferromagnetic bodies 140, the display device 100 can be fixed to the wall part 200.

Meanwhile, when the mounting jig 500 including the plurality of jig magnets 530 is brought into contact with the display device 100 while the display device 100 is fixed to the wall part 200 as described above, magnetic force lines that are stronger than magnetic force lines induced between the display panel 100 and the wall part 200 may be induced between the mounting jig 500 and the display device 100. That is, the wall part 200 may be formed of a metallic material instead of a magnet, whereas the jig magnets 530 are disposed on the mounting jig 500, so that when the mounting jig 500 is brought into contact with the display device 100, a magnitude of the first magnetic force line ML1 induced to the mounting jig 500 and the display device 100 may be greater than a magnitude of the second magnetic force line ML2 induced to the display device 100 and the wall part 200. This is because the wall part 200 is not originally formed of a magnet having magnetic force, but is formed of a material allowing for induction of a magnetic force line, so that the magnetic force line changes toward the plurality of jig magnets 530 of the mounting jig 500 having a stronger magnetic force than the wall part 200. This may be understood as a magnetic characteristic corresponding to an electrical characteristic in which current flows toward a wiring having a lower resistance among the plurality of wirings. Accordingly, in the display device 100, the tiling display device TD, and the manufacturing method of the tiling display device TD according to an embodiment of the present disclosure, an operator can easily align the display device 100 using the mounting jig 500, and the display device 100 can be easily disassembled from the wall part 200.

However, when the display device 100 includes only the plurality of panel magnets 130 and does not include the plurality of panel ferromagnetic bodies 140 in contact with the plurality of panel magnets 130 and in contact with the wall part 200, a magnetic field between the plurality of panel magnets 130 and the wall part 200 may not be changed. Specifically, unlike a ferromagnetic body, since a magnet has magnetism all the time, in a case in which a separate panel ferromagnetic body 140 does not exist between the plurality of panel magnets 130 and the wall part 200, when the mounting jig 500 comes into contact with the display device 100, magnetic forces between the display device 100 and the wall part 200 may be amplified. That is, since the magnetism of the magnets of the mounting jig 500 is added to the magnetism of the panel magnets 130 of the display device 100, the display device 100 can be more firmly fixed to the wall part 200, and it may be very difficult to align or disassemble the display device 100 using the mounting jig 500. On the other hand, in the display device 100, the tiling display device TD, and the manufacturing method of the tiling display device according to an embodiment of the present disclosure, when the mounting jig 500 is brought into contact with the display device 100 by using the plurality of panel ferromagnetic bodies 140 in contact with the plurality of panel magnets 130 in the display device 100, the second magnetic force line ML2 of which a magnitude is less than a magnitude of the third magnetic force line ML3 that is induced to the plurality of panel magnets 130 and the wall part 200, may be induced to the plurality of panel magnets 130 and the wall part 200, and the first magnetic force line ML1 of which a magnitude is greater than the magnitude of the second magnetic force line ML2 may be induced to the plurality of jig magnets 530 and the plurality of panel magnets 130. Accordingly, in the display device 100, the tiling display device TD, and the manufacturing method of the tiling display device according to an embodiment of the present disclosure, an operator can more easily align the display device 100 using the mounting jig 500 and the display device 100 can be easily disassembled from the wall part 200.

In addition, in the mounting jig 500 and the manufacturing method of a tiling display device using the mounting jig 500 according to an embodiment of the present disclosure, when a misalignment of a portion of the display devices 100 constituting the tiling display device TD is found, a distance and an arrangement between the plurality of display devices 100 may be easily realigned without disassembling and reassembling the entirety of the plurality of display devices 100. That is, since the display device 100 that needs to be realigned can be realigned by attaching the mounting jig 500 to the display device 100 in the front of the tiling display device TD, the realignment of the display device 100 may be easily performed without disassembling or reassembling the plurality of display devices 100.

In addition, in the mounting jig 500 and the manufacturing method of a tiling display device using the mounting jig 500 according to an embodiment of the present disclosure, it is possible to reduce damage to display devices 100 adjacent to each other by an impact in an alignment process of the plurality of display devices 100. Referring to FIG. 3, the panel magnets 130 that are disposed side by side in the X-axis direction may be disposed so that the same polarities thereof are placed side by side. Accordingly, each of the N-pole 132N and the S-pole 132S of the second panel magnet 132 of one display device 100 may be disposed side by side with the N-pole 131N and the S-pole 131S of the first panel magnet 131 of another display device 100 that is disposed adjacent to the one display device 100. In addition, each of the N-pole 134N and the S-pole 134S of the fourth panel magnet 134 of one display device 100 may be disposed side by side with the N-pole 133N and the S-pole 133S of the third panel magnet 133 of another display device 100 that is disposed adjacent to the one display device 100. Accordingly, in a process of aligning one display device 100, when the one display device 100 is brought close to another display device 100 adjacent to the one display device 100, the plurality of panel magnets 130 disposed in the other display device 100 that is disposed side by side with the plurality of panel magnets 130 disposed in the one display device 100 may be disposed so that the same polarities thereof are placed side by side. Accordingly, a repulsive force may be generated between the plurality of panel magnets 130 disposed in one display device 100 and the plurality of panel magnets 130 disposed in the other display device 100. Accordingly, in the process of aligning one display device 100, it is possible to reduce damage to another adjacent display device 100 due to a rapid movement of the display device 100.

The exemplary embodiments of the present disclosure can also be described as follows:

According to an aspect of the present disclosure, a mounting jig for manufacturing a tiling display device includes a supporting member, a plurality of jig magnets fixed to the supporting member, a hinge structure configured to rotate the plurality of jig magnets, and a guard rail rotating in response to rotation of the plurality of jig magnets and reducing damage caused during detachment or attachment.

The supporting member may include a first supporting member, a second supporting member extending in the same direction as the first supporting member and spaced apart from the first supporting member, a third supporting member connected to the first supporting member and the second supporting member, and a fourth supporting member connected to the first supporting member and the second supporting member and spaced apart from the third supporting member.

The mounting jig may further include a plurality of jig ferromagnetic bodies disposed on two side surfaces facing each other among side surfaces of each of the plurality of jig magnets, and a supporting shaft and a ferromagnetic protrusion that protrude in a direction in which the third supporting member extends from some jig ferromagnetic bodies that are adjacent to both ends of the third supporting member and both ends of the fourth supporting member among the plurality of jig ferromagnetic bodies. The supporting shaft and the ferromagnetic protrusion may be inserted into a through hole and a first guide part of the guard rail.

The guard rail may include a first plate extending in a direction in which the third supporting member extends, second plates extending from both ends of the first plate in a direction in which the first supporting member and the second supporting member extend and including the through hole and the first guide part, and third plates extending from one ends of the second plates toward the first supporting member and the second supporting member.

The third plates may be spaced apart from the first supporting member and the second supporting member.

The mounting jig may further include a fixing part disposed on a surface opposite to a surface facing the jig ferromagnetic body among both surfaces of the second plate; and an elastic member including one end connected to a portion of the ferromagnetic protrusion that is inserted into the first guide part and protrudes to an outside of the second plate and the other end connected to the fixing part.

The elastic member may be connected to the supporting shaft, and the elastic member may have an elastic force that spaces one end of the elastic member and the other end of the elastic member from each other.

The mounting jig may further include a handle connected to the supporting member. The plurality of jig magnets, the plurality of jig ferromagnetic bodies, and the handle may rotate based on the hinge structure. The guard rail may rotate based on the supporting shaft.

The mounting jig may further include a hinge protrusion protruding from the hinge structure toward the second plate; and a second guide part which is disposed in the second plate and along which the hinge protrusion slides. One end of the second guide part may be in communication with the outside of the second plate, and the other end of the second guide part may be disposed in the second plate.

Each of the plurality of jig ferromagnetic bodies may include first portions disposed to be in contact with one of S-poles or N-poles of the plurality of jig magnets and second portions disposed to be in contact with the other one of the N-poles or the S-poles of the plurality of jig magnets.

According to another aspect of the present disclosure, a manufacturing method of a tiling display device includes attaching a mounting jig including a plurality of jig magnets to a display device including a plurality of panel magnets and a plurality of panel ferromagnetic bodies; attaching the display device to a wall part using the mounting jig; and detaching the mounting jig from the display device, wherein prior to the attaching of the mounting jig, a first plate of a guard rail of the mounting jig is disposed between the plurality of jig magnets and the display device.

The mounting jig may further include a plurality of jig ferromagnetic bodies disposed on both side surfaces of the plurality of jig magnets; supporting members connected to the plurality of jig magnets; and hinge structures connected to the supporting members. The guard rail may include second plates extending from both ends of the first plate and rotatably connected to at least some of the plurality of jig ferromagnetic bodies, third plates extending from one ends of the second plates, through holes disposed in the second plates and into which supporting shafts protruding from the plurality of jig ferromagnetic bodies are inserted, first guide parts which are disposed in the second plates and along which ferromagnetic protrusions protruding from the plurality of jig ferromagnetic bodies slide, and second guide parts which are disposed in the second plates and along which hinge protrusions protruding from the hinge structures slide.

The manufacturing method may further include disposing the mounting jig in a first state before the attaching of the mounting jig to the display device. In the disposing of the mounting jig in the first state, the first plate may be disposed to face a surface attached to the display device among a plurality of surfaces of the plurality of jig magnets, and the ferromagnetic protrusion may be disposed at an end adjacent to the third plate among both ends of the first guide part.

The attaching of the mounting jig may include disposing the mounting jig in the first state in a second state; and disposing the mounting jig in the second state in a third state. When the mounting jig is in the second state, the hinge structures may be in contact with the display device, and the plurality of jig magnets may be spaced apart from the display device.

In the disposing of the mounting jig in the second state in the third state, the plurality of jig magnets and the guard rail may rotate in opposite directions, and the ferromagnetic protrusion may slide toward an end adjacent to the first plate among the both ends of the first guide part. When the mounting jig is in the third state, the plurality of jig magnets and the plurality of jig ferromagnetic bodies may be in contact with the display device to correspond to the plurality of panel magnets and the plurality of panel ferromagnetic bodies, and an edge of the first plate, an edge of the second plate and an edge of the third plate may be in contact with the display device.

The detaching of the mounting jig from the display device may include disposing the mounting jig in the third state in a fourth state. In the disposing of the mounting jig in the third state in the fourth state, the plurality of jig magnets, the plurality of jig ferromagnetic bodies, and the guard rail may be rotated in the same direction.

In the disposing of the mounting jig in the third state in the fourth state, the first plate may rotate to be away from the display device based on the edge of the third plate in contact with the display device and the hinge protrusion may slide toward an inside of the second guide part.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A mounting jig for manufacturing a tiling display device, the mounting jig comprising:
   a supporting member;
   a plurality of jig magnets fixed to the supporting member;
   a hinge structure configured to rotate the plurality of jig magnets; and
   a guard rail configured to rotate in response to a rotation of the plurality of jig magnets, to reduce damage caused during detachment or attachment,
   wherein the tiling display device includes a plurality of display devices disposed in the form of tiles, wherein each of the plurality of display devices includes a plurality of display elements, a plurality of circuits, a plurality of lines and a plurality of parts, wherein the plurality of display elements is a light emitting diode (LED) or a micro-LED including an n-type semiconductor layer, a p-type semiconductor layer, and a light emitting layer.

2. The mounting jig of claim 1, wherein the supporting member includes:
a first supporting member;
a second supporting member extending in a same direction as the first supporting member and spaced apart from the first supporting member;
a third supporting member connected to the first supporting member and the second supporting member; and
a fourth supporting member connected to the first supporting member and the second supporting member and spaced apart from the third supporting member.

3. The mounting jig of claim 2, further comprising:
a plurality of jig ferromagnetic bodies disposed on two side surfaces facing each other among side surfaces of each of the plurality of jig magnets; and
a supporting shaft and a ferromagnetic protrusion that protrude in a direction in which the third supporting member extends from some jig ferromagnetic bodies that are adjacent to both ends of the third supporting member and both ends of the fourth supporting member among the plurality of jig ferromagnetic bodies,
wherein the supporting shaft and the ferromagnetic protrusion are inserted into a through hole and a first guide part of the guard rail.

4. The mounting jig of claim 3, wherein the guard rail includes:
a first plate extending in the direction in which the third supporting member extends;
second plates extending from both ends of the first plate in the direction in which the first supporting member and the second supporting member extend, and including the through hole and the first guide part; and
third plates extending from one ends of the second plates toward the first supporting member and the second supporting member.

5. The mounting jig of claim 4, wherein the third plates are spaced apart from the first supporting member and the second supporting member.

6. The mounting jig of claim 4, further comprising:
a fixing part disposed on a surface opposite to a surface facing the jig ferromagnetic body among both surfaces of the second plate; and
an elastic member including one end connected to a portion of the ferromagnetic protrusion that is inserted into the first guide part and protrudes to an outside of the second plate and another end connected to the fixing part.

7. The mounting jig of claim 6, wherein the elastic member is connected to the supporting shaft, and
the elastic member has an elastic force that spaces one end of the elastic member and another end of the elastic member from each other.

8. The mounting jig of claim 4, further comprising:
a handle connected to the supporting member,
wherein the plurality of jig magnets, the plurality of jig ferromagnetic bodies, and the handle rotate based on the hinge structure, and
wherein the guard rail rotates based on the supporting shaft.

9. The mounting jig of claim 8, further comprising:
a hinge protrusion protruding from the hinge structure toward the second plate; and
a second guide part which is disposed in the second plate and along which the hinge protrusion slides,
wherein one end of the second guide part is in communication with an outside of the second plate, and another end of the second guide part is disposed in the second plate.

10. The mounting jig of claim 3, wherein each of the plurality of jig ferromagnetic bodies includes:
first portions disposed to be in contact with one of S-poles or N-poles of the plurality of jig magnets, and
second portions disposed to be in contact with the other one of the N-poles or the S-poles of the plurality of jig magnets.

11. A manufacturing method of a tiling display device, the manufacturing method comprising:
attaching a mounting jig including a plurality of jig magnets to a display device including a plurality of panel magnets and a plurality of panel ferromagnetic bodies;
attaching the display device to a wall part in the form of tiles using the mounting jig; and
detaching the mounting jig from the display device,
wherein before the attaching of the mounting jig, a first plate of a guard rail of the mounting jig is disposed between the plurality of jig magnets and the display device,
wherein each of the plurality of display devices includes a plurality of display elements, a plurality of circuits, a plurality of lines and a plurality of parts,
wherein the plurality of display elements is a light emitting diode (LED) or a micro-LED including an n-type semiconductor layer, a p-type semiconductor layer, and a light emitting layer,
wherein the attaching the display device to the wall part includes:
rotating the plurality of jig magnets in response to a hinge structure, and
rotating the guard rail in response to rotation of the plurality of jig magnets to reduce damage caused during detachment or attachment.

12. The manufacturing method of claim 11, wherein the mounting jig further includes:
a plurality of jig ferromagnetic bodies disposed on both side surfaces of the plurality of jig magnets;
supporting members connected to the plurality of jig magnets; and
hinge structures connected to the supporting members,
wherein the guard rail includes:
second plates extending from both ends of the first plate and rotatably connected to at least some of the plurality of jig ferromagnetic bodies;
third plates extending from one ends of the second plates;
through holes disposed in the second plates and into which supporting shafts protruding from the plurality of jig ferromagnetic bodies are inserted;
first guide parts which are disposed in the second plates and along which ferromagnetic protrusions protruding from the plurality of jig ferromagnetic bodies slide; and
second guide parts which are disposed in the second plates and along which hinge protrusions protruding from the hinge structures slide.

13. The manufacturing method of claim 12, further comprising:
disposing the mounting jig in a first state before the attaching of the mounting jig to the display device, wherein in the disposing of the mounting jig in the first state, the first plate is disposed to face a surface attached to the display device among a plurality of surfaces of the plurality of jig magnets, and the ferromagnetic protrusion is disposed at an end adjacent to the third plate among both ends of the first guide part.

14. The manufacturing method of claim 13, wherein the attaching of the mounting jig includes disposing the mounting jig in the first state in a second state, and wherein when the mounting jig is in the second state, the hinge structures are in contact with the display device, and the plurality of jig magnets are spaced apart from the display device.

15. The manufacturing method of claim 14, wherein the attaching of the mounting jig further includes disposing the mounting jig in the second state in a third state, wherein in the disposing of the mounting jig in the second state in the third state, the plurality of jig magnets and the guard rail rotate in opposite directions, and the ferromagnetic protrusion slides toward an end adjacent to the first plate among the both ends of the first guide part, and wherein when the mounting jig is in the third state, the plurality of jig magnets and the plurality of jig ferromagnetic bodies are in contact with the display device to correspond to the plurality of panel magnets and the plurality of panel ferromagnetic bodies, and an edge of the first plate, an edge of the second plate and an edge of the third plate are in contact with the display device.

16. The manufacturing method of claim 15, wherein the detaching of the mounting jig from the display device includes disposing the mounting jig in the third state in a fourth state, and wherein in the disposing of the mounting jig in the third state in the fourth state, the plurality of jig magnets, the plurality of jig ferromagnetic bodies, and the guard rail are rotated in a same direction.

17. The manufacturing method of claim 16, wherein in the disposing of the mounting jig in the third state in the fourth state, the first plate rotates to be away from the display device based on the edge of the third plate in contact with the display device and the hinge protrusion slides toward an inside of the second guide part.

18. The mounting jig of claim 1, wherein each of the plurality of display devices further comprises:

a metal plate disposed on a rear surface of each of a plurality of display panels, wherein the metal plate is a back cover for supporting and protecting the plurality of display panels and dissipating heat generated from the plurality of display panels.

19. The mounting jig of claim 18, wherein each of the plurality of display devices further comprises:

a plurality of panel magnets disposed on a rear surface of the metal plate, and a plurality of panel ferromagnetic bodies disposed on the rear surface of the metal plate and disposed on both side surfaces of each of the plurality of panel magnets.

20. The mounting jig of claim 19, wherein each of the plurality of panel ferromagnetic bodies comprises:

a first portion disposed to be in contact with one of S-poles or N-poles of the plurality of panel magnets, and a second portion disposed to be in contact with the other one of the N-poles or the S-poles of the plurality of panel magnets.

* * * * *